US007002501B2

(12) United States Patent
Gulati et al.

(10) Patent No.: US 7,002,501 B2
(45) Date of Patent: *Feb. 21, 2006

(54) ANALOG-TO-DIGITAL CONVERTER HAVING PARAMETRIC CONFIGURABLITY

(75) Inventors: Kush Gulati, Cambridge, MA (US); Hae-Seung Lee, Bedford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/983,953

(22) Filed: Nov. 8, 2004

(65) Prior Publication Data

US 2005/0190092 A1 Sep. 1, 2005

Related U.S. Application Data

(63) Continuation of application No. 10/755,655, filed on Jan. 12, 2004, now Pat. No. 6,864,822, which is a continuation of application No. 09/735,219, filed on Dec. 12, 2000, now Pat. No. 6,686,860.

(51) Int. Cl.
*H03M 1/12* (2006.01)

(52) U.S. Cl. ..................... 341/155; 341/143; 341/172

(58) Field of Classification Search ................. 341/155, 341/143, 161, 163, 172
See application file for complete search history.

(56) References Cited

U.S. PATENT DOCUMENTS

| 5,677,691 | A | * | 10/1997 | Hosticka et al. | ............ 341/155 |
| 5,691,720 | A | | 11/1997 | Wang et al. | ................ 341/143 |
| 5,877,720 | A | * | 3/1999 | Setty et al. | ................. 341/159 |
| 5,936,562 | A | | 8/1999 | Brooks et al. | .............. 341/143 |
| 5,982,313 | A | | 11/1999 | Brooks et al. | .............. 341/143 |
| 6,005,506 | A | | 12/1999 | Bazarjani et al. | ........... 341/143 |
| 6,268,820 | B1 | | 7/2001 | Sherry et al. | ............... 341/143 |
| 6,288,664 | B1 | | 9/2001 | Swanson | ..................... 341/155 |
| 6,396,429 | B1 | * | 5/2002 | Singer et al. | ............... 341/155 |
| 6,686,860 | B1 | | 2/2004 | Gulati et al. | ................ 341/155 |
| 6,741,194 | B1 | * | 5/2004 | Cassagnes et al. | .......... 341/118 |
| 6,762,707 | B1 | * | 7/2004 | Wolf et al. | .................. 341/155 |
| 2004/0145508 | A1 | | 7/2004 | Gulati et al. | ................ 341/155 |

OTHER PUBLICATIONS

Stephen H. Lewis et al., "a Pipelined 5-M Sample/s 9-bit Analog-to-Digital Converter", IEEE Journal of Solid-State Circuits, vol. SC-22, No. 6, Dec. 1987, pp. 954-961.
Bernard Ginetti et al., "A CMOS 13-b Cyclic RSD A/D Converter", IEEE, Journal of Solid-State Circuits, vol. 27. No. 7, Jul. 1992; pp. 957-965.
Stephen A. Jantzi et al.; "A Fourth-Order Bandpass Sigma-Delta Modulator", IEEE Journal Of Solid-State Circuits, vol. 28, No. 3, March 1993; pp. 282-291.
"2.7 V to 5.5 V, High-Speed Low-Power Re-Configurable Analog-To-Digital Converter With 4-Input. Dual, Sample/ Hold, Parallel Interface And Power Down", Texas Instrument, Inc.; SLAS162; Apr., 1998, pp. 1-23.

(Continued)

*Primary Examiner*—Peguy JeanPierre
(74) *Attorney, Agent, or Firm*—Daly, Crowley, Mofford & Durkee, LLP

(57) ABSTRACT

A reconfigurable ADC includes a plurality of reconfigurable blocks for allowing the ADC to provide a plurality of architectures. In one embodiment, the ADC can be configured to operate in a pipeline mode and a sigma-delta mode. This arrangement provides an ADC having a relatively large range of bandwidth and resolution.

21 Claims, 23 Drawing Sheets

OTHER PUBLICATIONS

P. Setty. et al.; "FA 9.6: A. 5.75b 350Msample/s Reconfigurable Flash ADC for a PRML Road Channel", ISSCC98; Feb. 6, 1998 pp. 1-3.

Harlan Ohara et al.; A"CMOS Programmable Self-Calibrating 13-bit Eight Channel Data Acquisition Peripheral", IEEE 1987: pp. 930-938.

Geiger et al.; "VLSI Design Techniques for Analog and Digital Circuits; Analog Systems": 1990; pp. 642-649.

Stacy Ho: "Design of a Iobit IOMs/s Pipeline A/D Converter"; Thesis; 1992; pp. 11-20.

Johns & Martin; "Analog Integrated Circuit Design"; 1996; pp. 506-517, 522-527.

Max W. Hauser; "Principles of Oversampling A/D Conversion"; J. Audio Eng. Soc., vol. 39, No. 12, 1991; Jan./Feb.; pp. 3-14, 16-17. 19, 22-26.

Cheong Kun, A Low-Energy Resolution-Reconfigurable A/D Converter with a new Pipelined/Cyclic SAR Architecture, May 2004, pp. 1-8.

* cited by examiner

ANALOG-TO-DIGITAL CONVERTER HAVING PARAMETRIC CONFIGURABLITY

CROSS-REFERENCE TO RELATED APPLICATIONS

This Application is a continuation of U.S. patent application Ser. No. 10/755,655, now U.S. Pat. No. 6,864,822, filed on Jan. 12, 2004, which is a continuation of U.S. patent application Ser. No. 09/735,219 filed on Dec. 12, 2000, now U.S. Pat. No. 6,686,860, both of which are incorporated herein by reference in their entirety.

STATEMENTS REGARDING FEDERALLY SPONSORED RESEARCH

The Government may have certain rights in the invention pursuant to DARPA Contract No. DAAL-01-95-K-3526.

FIELD OF THE INVENTION

This invention relates generally to integrated circuits, and more particularly, to analog to digital converters.

BACKGROUND OF THE INVENTION

As is known in the art, analog-to-digital converters (ADCs) convert a signal in analog format to a signal in digital format. Conventional ADC circuits can have a variety of circuit architectures each of which has certain concomitant disadvantages. Known ADC architectures include pipeline, sigma-delta, cyclic, flash, successive approximation, and dual-slope. Each architecture is generally applicable to a limited operating range. That is, each of these architectures has strengths and weaknesses that make them more amenable to working in certain frequency and resolution ranges.

Some ADC architectures do not operate outside certain ranges or consume prohibitively high power in certain ranges as compared to other architectures. Even within preferred operating ranges, a given architecture can have a performance level that is dictated by certain circuit parameters that are fixed for a given design. For example, ADCs generally include op amps that operate at a speed dictated by the bandwidth required of them. To operate at different speeds, the op amp bandwidth must be altered in an efficient way. Likewise, the resolution of certain ADC architectures is fixed by the thermal noise contribution of the components within it and hence varies with the circuit design.

There have been various attempts to create digitization systems having a relatively wide operating range. One such method includes employing a single very high-performance ADC that can work at the highest common denominator of resolution and sampling rate. However, this strategy is not practical and is extremely power inefficient.

An alternate approach employs multiple A/D converter architectures each covering a small sector in the overall two-dimensional space. This implementation, however, requires a prohibitively large number of ADCs to achieve optimal power consumption with a reasonably fine granularity over input bandwidth and resolution. For example, the fraction of the application space bounded by data-rate and resolution ranging between 20 Hz–20 Khz and 8–18 bits, respectively; in order for the system to achieve a power consumption that in the worst case is as much as a factor four times the optimal level—would require the system to include 50 different converters working in tandem. This does not even consider a higher portion of the bandwidth spectrum. In a discrete chip implementation, there would be a tremendous power overhead merely due to vast amounts of PCB wiring to connect the various architectures.

U.S. Pat. No. 5,691,720 entitled "Delta sigma analog-to-digital converter having programmable resolution/bias current circuitry and method" provides variable resolution in a delta-sigma type ADC by controlling the Oversampling Ratio (OSR) of the ADC over certain fixed values. In order to make the opamps settle faster (because of the varying clock frequency), the bias current is varied over values that are predetermined for the each of the different oversampling ratios. This fixed arrangement offers relatively limited resolution reconfigurability at lower bandwidths. In addition, relying upon a predetermined bias current for each oversampling ratio works only if the relationship of speed of the operational amplifiers versus its bias current is fixed. However, this relationship does not hold over different fabrication processes. Even within the same process, it is not possible to know this relationship (especially since bias current variation would place the input devices of the opamps into different regimes) in advance of building the chip. While it is possible to make a calibration run for a given process and chip, this adds significant cost.

In another prior art attempt, Texas Instruments of Dallas Tex., manufactures an ADC having part number TLV1562. Currently, this ADC operates only at the following selected values: 10 bit/3 Msps, 8 bit/4 Msps and 4 bit/8 Msps. Thus, this ADC offers limited reconfigurability.

U.S. Pat. No.5,877,720 entitled "Reconfigurable analog-to-digital converter" discloses a flash ADC having a limited reconfigurability, i.e., 2 settings: 5.75 b 350 Msample/s or 6.75 b 150 Msample/s.

Yet another approach is described in "A CMOS Programmable Self-Calibrating 13-bit Eight Channel Data Acquisition Peripheral," Ohara et. al., Journal of Solid-State Circuits, December, 1989. This article describes an ADC having resolution reconfigurability with a single cyclic ADC that can be configured for 8, 13, or 16 cycles. It should be noted that this architecture can work at 16 bits only with elaborate digital calibration.

It would, therefore, be desirable to provide a reconfigurable ADC that overcomes the aforesaid and other disadvantages.

SUMMARY OF THE INVENTION

The present invention provides an ADC circuit having a series of circuit blocks that can be reconfigured for a selected architecture to optimize the ADC for a particular resolution and data rate. This arrangement provides an ADC that can cover a relatively large resolution and data rate space with minimum power consumption at each performance level.

In one aspect of the invention, a reconfigurable ADC in accordance with the present invention is architecturally configurable such that the ADC can be configured in a selected one of a plurality of architectures. The reconfigurable ADC includes a plurality of reconfigurable blocks each having a capacitor array and at least one switch array and reconfiguration interface circuitry. The arrays provide a digitized signal to an interface circuit and a processed analog signal to the next reconfigurable block. The capacitor array and switch arrays are configured to provide a selected ADC architecture. In one embodiment, the ADC can be configured to operate in a pipeline mode and a sigma-delta mode.

In a further aspect of the invention, a phase-locked loop (PLL) circuit provides optimal bias current signal to the ADC opamps based upon an input clock signal and the desired resolution. In one embodiment, the PLL circuit includes a phase-frequency detector that provides an output signal proportional to a frequency difference between the input clock signal and an oscillation frequency of a voltage controlled oscillator. The frequency difference output signal is integrated using a charge pump and its output presented to a voltage-to-current converter circuit that provides an optimal bias current signal to the ADC opamps. Thus, the PLL circuit provides bandwidth reconfigurability.

In one embodiment, the voltage controlled oscillator includes a series of opamps having substantially similar characteristics to those of the opamps in the ADC. With this arrangement, the oscillation frequency of the voltage controlled oscillator is proportional to the speed of the opamps, which is non-linearly proportional to the opamp bias current. The voltage controlled oscillator frequency tracks the clock input signal frequency such that an increase in the clock input signal frequency, i.e., a higher sampling frequency, causes a concomitant increase in the opamp bias current. Thus, the speed of the opamps is linearly proportional to the input clock signal frequency.

In a further aspect of the invention, the ADC is parametrically configurable for power optimization in relation to the selected resolution. In one embodiment, the capacitors in the reconfigurable blocks are scaled from block to block. In an exemplary embodiment having eight reconfigurable blocks, the second reconfigurable block can have capacitors that are one-fourth the size of the capacitors in the first block, for example. In addition, the particular blocks enabled for a given resolution can be selected based upon the size of the capacitors in the respective blocks.

A reconfigurable ADC in accordance with the present invention can digitize a relatively wide range of input bandwidth and provide a relatively wide resolution range while maintaining optimal power performance through the input-bandwidth/resolution space. In one embodiment, the input bandwidth is in the range of about 1 Mhz to about 20 Mhz and the resolution is in the range of about 2 bits to about 18 bits.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
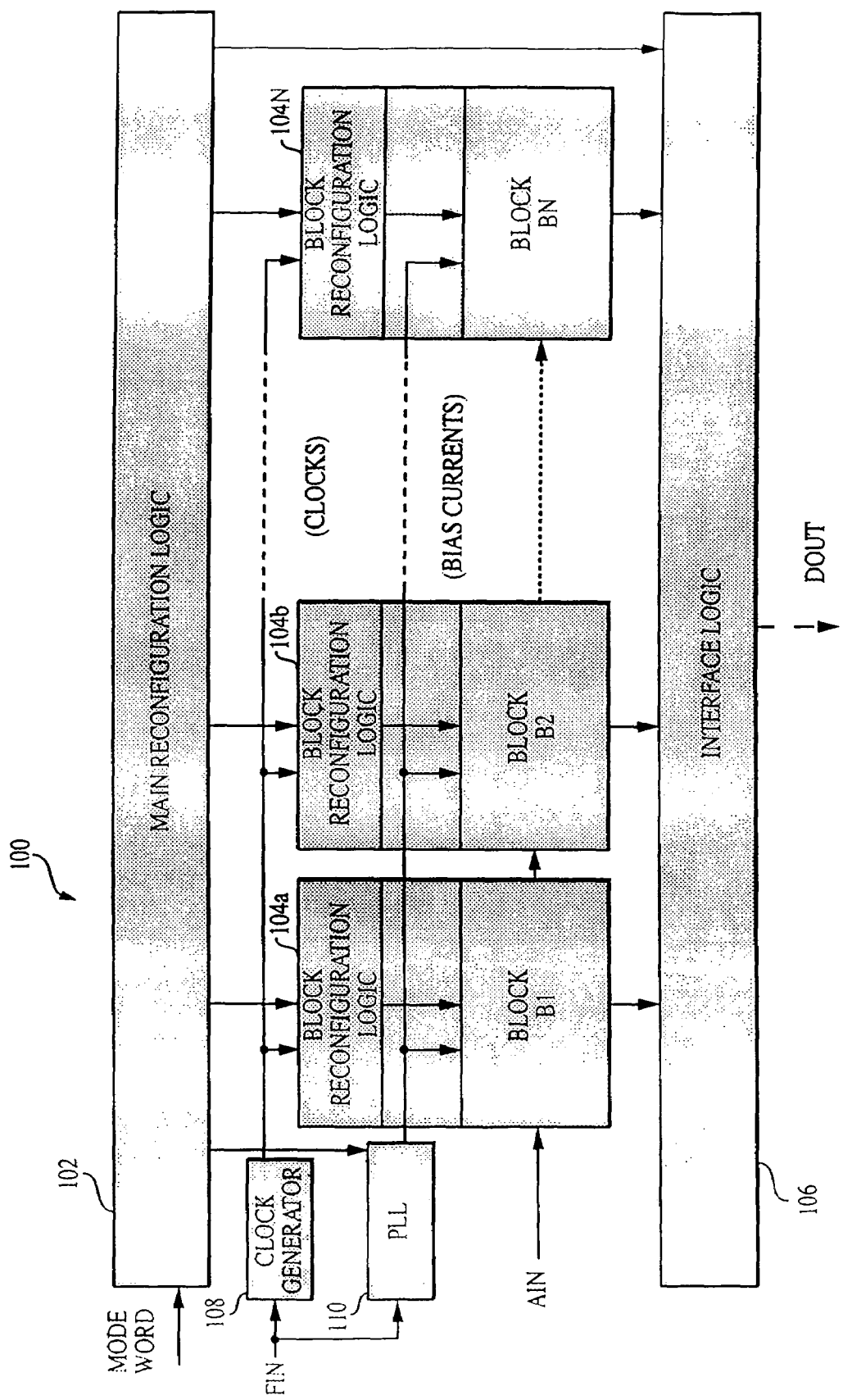
FIG. 1 is a block diagram of a reconfigurable analog-to-digital (A/D) converter (ADC) in accordance with the present invention.

In general, the reconfigurability of the analog-to-digital converter ADC (or A/D converter) of the present invention enable the ADC to cover a relatively large portion of the rate-resolution space. The ADC provides the ability to select an architecture for the A/D conversion based upon the input signal characteristics and output signal requirements. That is, an A/D architecture is selected to optimize performance in a given region in the application space, i.e., bandwidth and resolution. This arrangement allows the A/D to be re-configured such that the need for fixed multiple converter architectures is eliminated.

Before entering into a description of the figures, a general ADC overview is provided. As known to one of ordinary skill in the art, certain A/D architectures that cover various portions on the application space share certain basic devices, such as operational amplifiers, switched capacitors and comparators. One difference between the various architectures, from a network viewpoint, is the interconnection between the basic devices. The present invention provides a reconfigurable interconnection scheme for the basic devices to allow A/D operation at a wide range of bandwidths and resolutions.

Known A/D architectures include flash, pipeline, dual-slope, charge redistribution converters, cyclic, and over-sampling noise shaping (sigma-delta). Each of these architectures is best suited to work over a certain limited range of signal bandwidth and desired resolution. In addition, these architectures each possess an abundance of parametric variational possibilities, such as the number of comparators in a flash ADC, the number of pipeline stages, the order of the sigma-delta ADC, the size of capacitors employed, the coefficients of the sigma-delta. It is the "parametric variability" of these various architectures that allows them to work and be power optimal over a range of resolution/bandwidth.

The present invention provides a subset of architectures that bear topological similarity so as to maximize the operating range over the A/D application space. The pipeline ADC, cyclic ADC and the sigma-delta ADC lend themselves to a single reconfigurable ADC in accordance with the present invention due to device commonality.

The operation of a pipeline ADC is well known to one of ordinary skill in the art. In general, a pipeline ADC employs a binary search algorithm implemented in a series of cascaded switched-capacitor ×2 gain and adder stages provided from a plurality of opamps, switched capacitors and comparators. A conventional pipeline ADC is particularly suitable over a low-medium resolution/medium-high bandwidth, e.g., 4–12 bits/100 KHz–100 MHz.

A cyclic ADC is similar in operation to the pipeline ADC, but utilizes fewer stages and re-circulates signal residues cyclically through the stages. In general, a Cyclic ADC emulates a number of stages that is an integer multiple of the number of stages it actually possesses. To generate N bits of digital information, the cyclic A/D re-circulates data residues through a stage N times. The cyclic ADC is well suited for low-medium bandwidths and generates low-medium resolutions, e.g., 4–12 bits/10 KHz–1 MHz.

The topology of a sigma-delta ADC includes a number of cascaded stages of multiple input switched capacitor integrators and a comparator. The sigma-delta ADC oversamples the input signal and shapes the comparator quantization noise away from the input signal band. It is suitable for low-medium input bandwidths and medium-high resolution, e.g.,13–20 bits/1 Hz–100 KHz.

For the same clock frequency, the cyclic A/D works at 1/Nth the bandwidth of the pipeline ADC, and consumes about 1/Nth the power; where N is the desired resolution. Hence, these two architectures have an identical figure of merit (considering power, speed and resolution) to the first order approximation. A pipeline ADC having opamp scaling boosts its performance metric over that of the cyclic ADC. This makes the pipeline with scaled opamps more attractive than the cyclic architecture.

Nonetheless, the cyclic, is more power optimal at lower bandwidths than the pipeline ADC. The minimum clock speed of any ADC is limited by the leakage across the capacitors in its switch-capacitor network. In other words, the clock speed of the ADC cannot be too low since the charge across the switched-capacitors (typically in the order of a few tens of femto-farads) leaks out to the extent that the ADC fails to meet the desired resolution. Assuming, that both ADCs sample the input at the Nyquist rate, for the same bandwidth, the clock frequency of the cyclic ADC is N times higher than the pipeline ADC. Thus, the minimum attainable bandwidth of the cyclic ADC is N times lower than that of the pipeline. As described below, the reconfigurable ADC of the present invention can work optimally in a pipelined over-sampling mode. That is, the signal bandwidth of the pipeline can be significantly lower than the clock frequency—thus offsetting an advantage of the cyclic ADC.

In view of the above, the reconfigurable ADC of the present invention is primarily shown and described as providing sigma-delta architecture and the pipeline architecture. It is understood, however, that embodiments including the cyclic architecture are considered within the scope of the invention and may be preferred for certain applications.

Since the pipeline and sigma-delta architectures share basic devices such as operational amplifiers, switched capacitors and comparators, the reconfigurable ADC can include basic building blocks each including these common devices that can be "configured" for these topologies.

FIG. 1 shows a reconfigurable ADC 100 in accordance with the present invention. In general, the ADC 100 includes a series of cascaded configurable blocks B1-N coupled to a main reconfiguration logic circuit 102 via respective block reconfiguration logic circuits 104a-N. The main reconfiguration logic block 102 receives configuration information, e.g., a mode word, from a circuit or from a user, for example. The mode word defines the mode of operation (pipeline or sigma-delta) for establishing the interconnection and structure of the ADC circuit. The main reconfiguration logic circuit 102 generates several internal reconfiguration bits that are provided to the block reconfiguration logic circuits 104 for configuring the configurable blocks B1-N. The reconfigurable blocks B1-N of the ADC can be configured to operate as a sample and hold (S/H) circuit and multiplier for two stages of the pipeline architecture as required in a pipeline mode and as a multiple input integrating summer with arbitrary coefficients in the sigma-delta mode, as described below.

The configurable blocks B1-N provide digitized signals to an interface logic circuit 106 that provides temporal and spatial alignment of the outputs from the configurable blocks B1-N. The interface logic circuit 106 then provides the aligned output data to the output drivers that send the digital signals out of the chip. An off-chip decimator can be employed for low-pass filtering and sample-rate reduction of the output stream while the ADC is in the sigma-delta mode.

An analog input signal Ain to be digitized by the ADC 100 is received by the first configurable block B1, which processes the signal and provides the processed signal to the next configurable block B2. Each block processes the signal from the previous block in a cascaded fashion.

An input clock signal Fin to the ADC 100 is received by a main clock generator circuit 108 and by a phase-locked loop (PLL) circuit 110. In one embodiment having eight reconfigurable blocks (N=8), the main clock generator 108 provides three delayed versions of the two phases of operation and presents these six clocks and their complements to the cascaded blocks, as described more fully below. The PLL 110 receives the input clock signal Fin and determines an appropriate bias current signal for the configurable blocks B1-N based upon the clock frequency and the selected resolution for the ADC, as also described more fully below.

Figure 2:
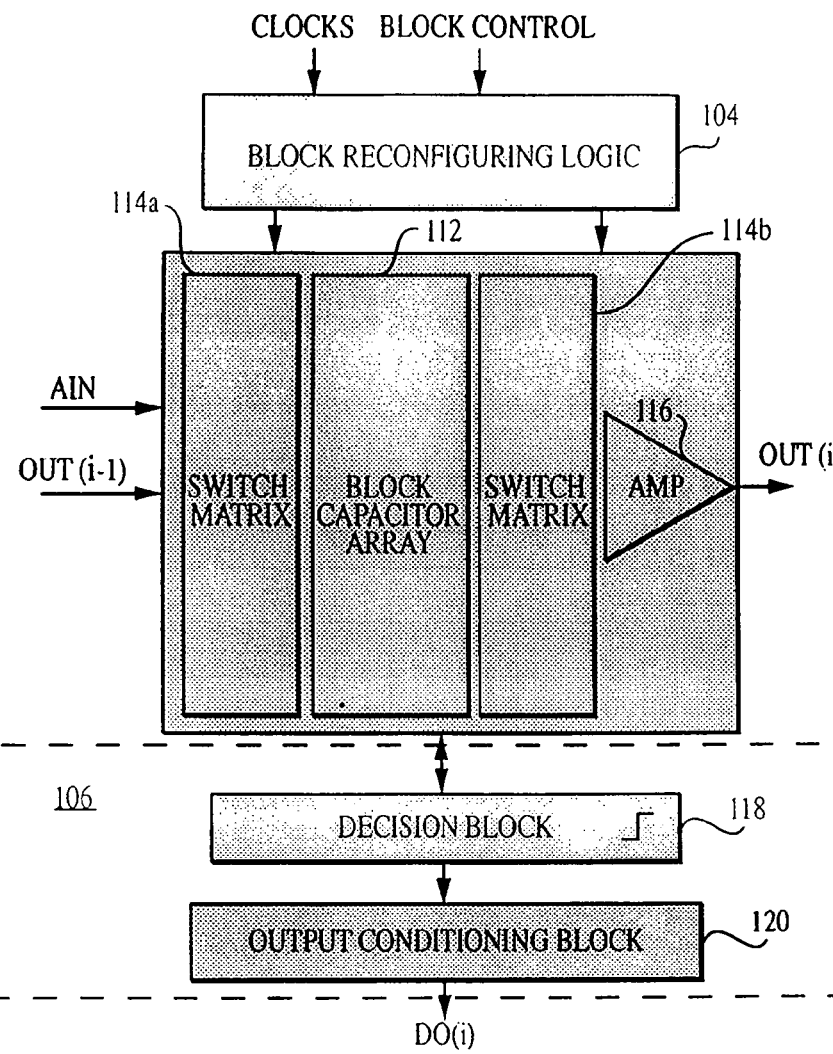
FIG. 2 is a block diagram of a reconfigurable block that forms a portion of the ADC of FIG. 1.

FIG. 2, in combination with FIG. 1, shows further details of the reconfigurable blocks B1-N of FIG. 1. The block reconfiguration logic circuit 104 for each block $B_i$ receives control signals from the main reconfiguration logic 102 and clock signals from the main clock generator 108. The reconfiguration circuit 104 provides the necessary clocks to the proper locations in the block, as described in detail below. Each block B includes a block capacitor array 112 sandwiched between first and second switch matrices 114a, b, which are configured by the block reconfiguring logic circuit 104. The first switch matrix 114a receives the analog input signal Ain or the output signal $OUT_{i-1}$ from the preceding block $B_{i-1}$ and connects these signals to the block capacitor array 112. The second switch matrix array 114b connects the capacitors in the block capacitor array 112 and provides a signal to an opamp 116. The opamp in conjunction with the capacitor and switch arrays produce the block output signal $OUT_i$ for the next block B(i+1) every clock phase.

The output from the opamp 116 is presented to the next block B(i+1) and to the decision block 118. The decision block 118 creates digital bits DO(i) that are sent out of the reconfigurable block B(i) through the output conditioning block 120, which provides output buffering, voltage levels and the like. The output of the decision block also serves to provide some configuration bits to the switch matrix 114a that are primarily related to whether and by how much the voltage residue from an amplification phase is shifted.

In an exemplary embodiment, the main reconfiguration logic 102 generates three sets of eight bits from the mode word. One of the eight bits in each set corresponds to a respective one of the eight reconfigurable blocks. The first set of eight bits ENB1–ENB8 provides enable bits for the blocks. The second set of eight bits F1–8 represents first block indicators. That is, one of the eight bits F1–8 is active to identify the location of the first active block. The third set of eight bits L1–L8 provides an indication of the last block to be enabled. One of the eight bits is active for determining the location of the last active block. In general, the desired resolution is primarily determined by which blocks are enabled and whether the ADC 100 is in pipeline or sigma-delta mode.

The ADC 100 can be reconfigured at architectural, parametric and bandwidth levels, as described in detail below. The ADC architecture can be placed in a pipeline configuration and a sigma-delta configuration. In the pipeline mode, for example, the switched-capacitor portion of each block is transformed to a S/H and multiply-by-2 stage for 2 pipeline stages. Parameters for each architecture can be selected based upon application requirements. In the pipeline mode, ADC resolution is determined by activating a corresponding number of reconfigurable blocks. In the sigma-delta mode, the oversampling ratio can be varied depending upon the resolution. Bandwidth reconfiguration includes adjusting the bias current level through circuit op amps depending upon a clock frequency.

Figure 3:
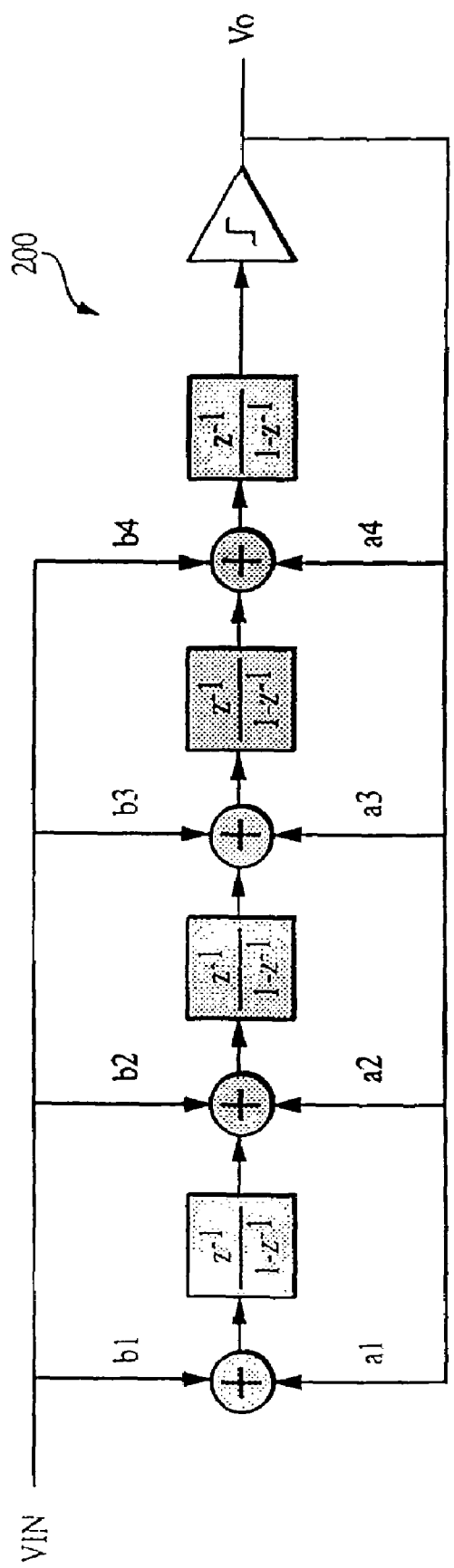
FIG. 3 is a schematic representation of the ADC of FIG. 1 configured in a sigma-delta architecture.

Referring now to FIG. 3, sigma-delta operation of the reconfigurable ADC is based on a fourth order distributed feedback cascade-of-integrators type architecture 200. One of ordinary skill in the art can readily determine optimal coefficients a1–4,b1–4 for sigma-delta operation. In one embodiment, the coefficients and the order of the delta-sigma architecture remain fixed through the resolution range of the ADC. The oversampling ratio (OSR) can be varied to execute resolution reconfiguration.

A fourth order arrangement is described herein to extract power savings that occur as a result of using scaled opamp blocks and to maximize power savings without running into stability complexity. It will be appreciated by one of ordinary skill in the art that higher and lower orders can be utilized depending upon the requirements of a particular application. It is understood that the order of the sigma-delta implementation can be readily modified by switching blocks on and off in the sigma-delta mod.

Each block of the reconfigurable ADC corresponds to one ADC stage. In general, the four sigma-delta stages are formed from four reconfigurable blocks, e.g., B1–4, of the ADC, as described more fully below. In this mode, each basic building block is configured to provide a multiple input integrator circuit. Selected blocks B1-N are activated in pipeline mode depending upon the selected resolution.

Figure 4:
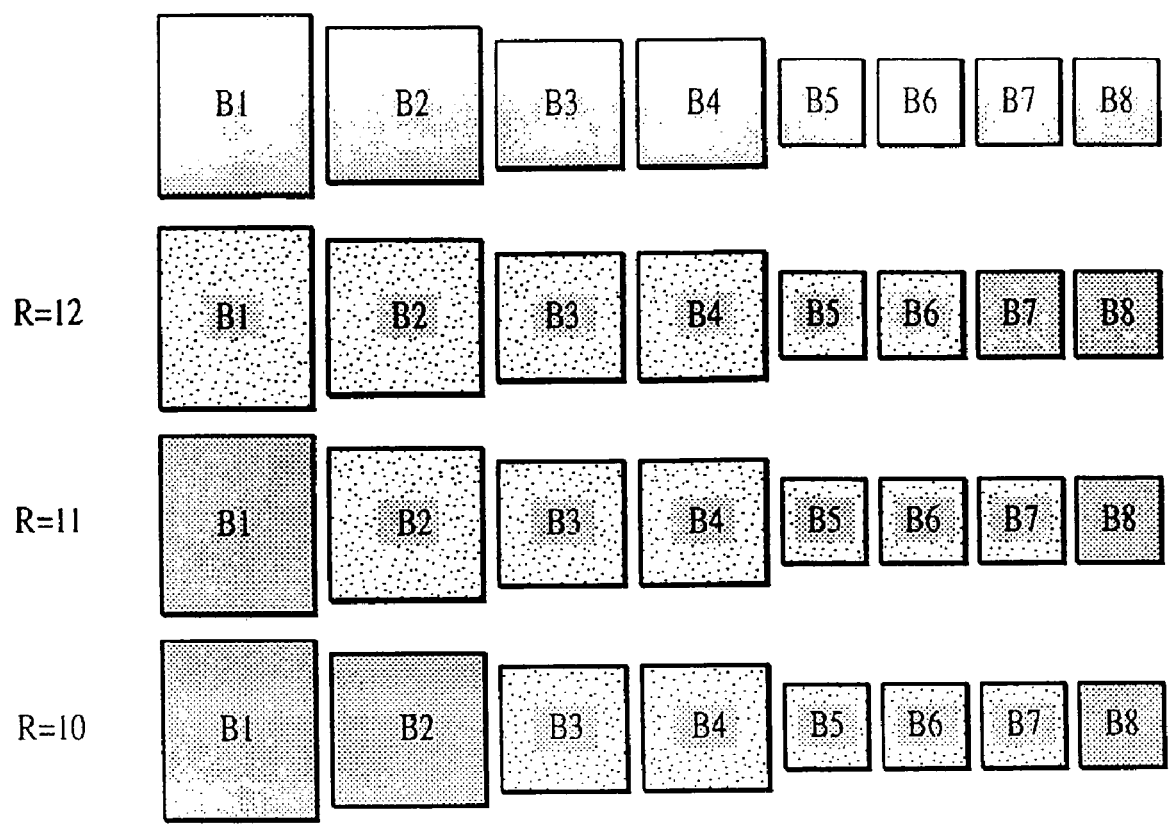
FIG. 4 is a pictorial representation of exemplary scaling of reconfigurable blocks that can form part of the ADC of FIG. 1.

As shown in FIG. 4, in the pipeline mode, the resolution is be selected by varying the number and location of the reconfigurable blocks B1-N that serve as the pipeline stages. In one embodiment, the first six blocks B1–6 are utilized for twelve bits of resolution. For eleven bits of resolution, the same number of blocks is employed but the pipeline is shifted to start from the second block B2. That is, blocks B2–7 are utilized to provide the eleven bits of resolution. Since B2 has capacitors that are a fourth of the size of the capacitors in B1 in one particular embodiment, as described below, the thermal noise contribution by the capacitors increases to two times that of the first block B1 for the first stage. It will be appreciated that this corresponds with the resolution reduction of 1 bit. For ten bits of resolutions, the pipeline starts at B3 and utilizes only 5 blocks, e.g., B3–8.

For an exemplary embodiment having eight reconfigurable blocks B1–8 and a maximum of twelve bits of resolution in pipeline mode, Table 1 below illustrates the correspondence between resolution and block enablement in the pipeline mode.

TABLE 1

| Resolution (bits) | Block enabled |
|---|---|
| 12 | B1–B6 |
| 11 | B2–B7 |
| 10 | B3–B7 |
| 9 | B4–B8 |
| 8 | B5–B8 |
| 7 | B5–B8 |
| 6 | B6–B8 |
| 5 | B6–B8 |
| 4 | B7–B8 |

Figure 5:
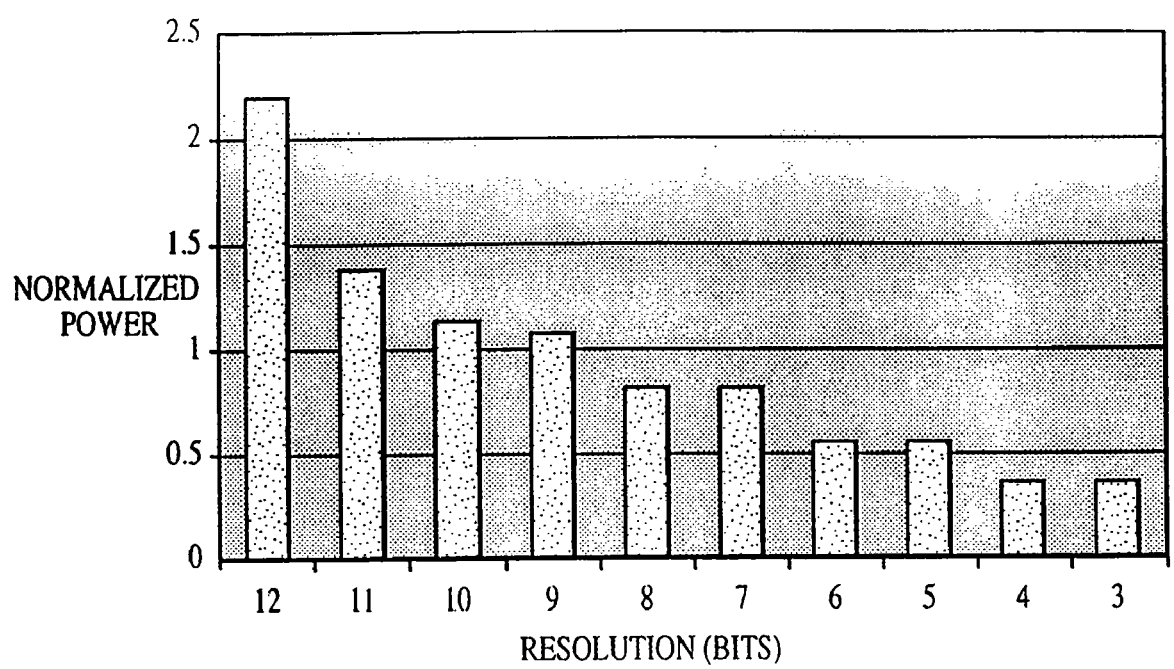
FIG. 5 is a graphical representation of power versus resolution for the ADC of FIG. 1.

Referring now to FIG. 5, the normalized power distribution versus resolution in pipeline mode is shown. The power curve for the ADC shows the power saving resulting from the exemplary block enablement scheme in Table 1. Since only the first few blocks are scaled, as shown in FIG. 4, the ADC power consumption reduces exponentially at the beginning, and becomes substantially linear relatively quickly. More particularly, the capacitors in the capacitor array are sized down to about the fundamental thermal limit to minimize the overall power consumption. One result of this arrangement is that stages reach the parasitic capacitance limitation sooner.

In the sigma-delta mode, varying the oversampling ratio of the ADC varies the resolution. The oversampling ratios required at various resolutions are set forth below in Table 2. That is, Table 2 shows the variation of sigma-delta mode resolution with oversampling rate (OSR).

TABLE 2

| Resolution (bits) | OSR | Expected Maximum Bandwidth (Fs = 20 Mhz) |
|---|---|---|
| 13 | 32 | 640 Khz |
| 14 | 64 | 160 Khz |
| 15 | 256 | 40 Khz |
| 16 | 1024 | 10 Khz |
| 17 | 4096 | 2.5 Khz |
| 18 | 16384 | 625 Hz |

Figure 6:
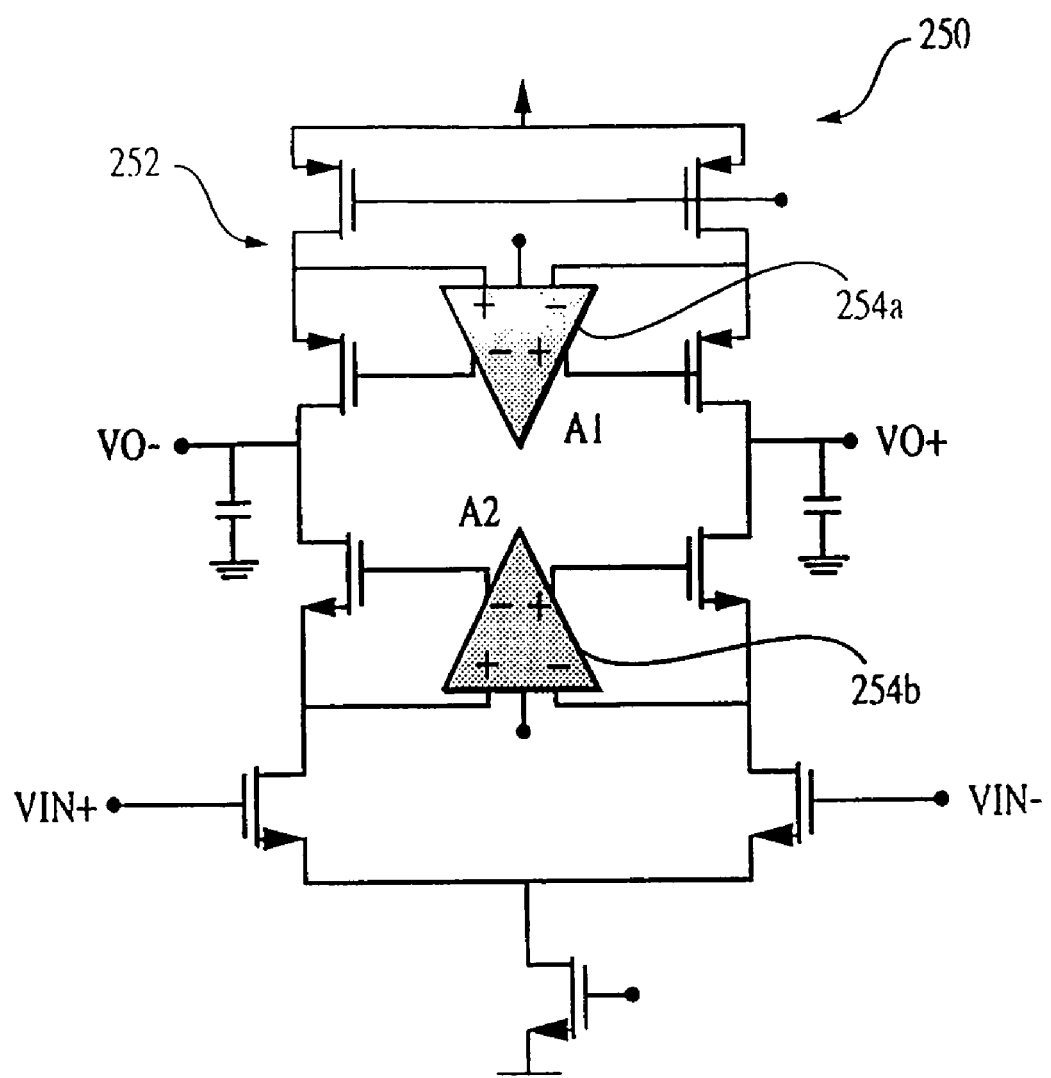
FIG. 6 is a schematic representation of an opamp that can form a part of the reconfigurable block of FIG. 2.

FIG. 6 shows an exemplary implementation for an opamp 250 used in each of the first five blocks B1–5. The differential opamp 250 includes conventional n-channel input device telescopic opamps 252 for receiving an input signal Vin+, Vin− and providing an output signal Vo+, Vo−. The opamp 250 can include first and second folded-cascade gain enhancement amplifiers 254a,b. The last three blocks B6–8 can include the same telescopic structure without the gain enhancement amplifiers 254.

It is understood that one of ordinary skill in the art can readily modify the opamp structure without departing from the present invention. For example, folded cascode and two stage structures can also be used with or without gain-enhancement. Likewise, the style of the gain-enhancement can be modified without departing from the present invention.

The gain enhancement amplifiers 254 can utilize a standard folded-cascode architecture to achieve desired speed and input/output voltage levels. Since the gain enhancement amplifiers 254 drive significantly smaller capacitive loads than the main block amplifier 250, the gain enhancement circuits can be scaled down with respect to the main amplifier. Here scaling refers to reducing device widths and current through the transistors. Such scaling does not change the voltage levels at various nodes in the circuit and minimizes power consumption and area associated with the gain enhancement. In one embodiment, after scaling, the power consumed by both gain-enhancement amplifiers 254 combined is about a third of the total power consumption of the opamp 250. The gain-enhancement amplifiers 254 can be identical along the various blocks except for scaling.

As described above, bandwidth reconfiguration of the opamps serves as one level of ADC reconfiguration. Bandwidth reconfiguration of the ADC includes modifying the bandwidth of the opamps in the ADC by tuning the current through the opamps to the value necessary for the stage outputs to settle to the appropriate level at that clock frequency. This is achieved using a phase-locked loop circuit to adjust the bias current to the opamps, as described more fully below.

In an exemplary embodiment, the amplifiers are designed such that all of the input devices possess a Vdsat of about 280 mV (at an input device current of 800 uA) and therefore in strong inversion. Reducing the clock frequency reduces the input current, which lowers the Vdsat of these devices until such time that they go into a moderate and later sub-threshold regime. The bias circuits are designed such that the Vds across these devices is always about 175% of the Vdsat (corresponding to a Vmargin of 75% of Vdsat) in order to ensure that they remain in saturation while in the strong/moderate inversion regimes. In order to keep these devices in saturation while in the sub-threshold regime, it is necessary to have a few kT/q across the drain-source terminals. This is achieved by making sure the Vds across the devices levels off at about 60 mV as current is continually reduced.

The design of the opamps (in the ADC and VCO) are done in such a manner that the speed of all the opamps is dominated by the small-signal settling time when the maximum rated current flows through them and that the slewing time approximately equals the small-signal settling time all through the region where the input devices are in the sub-threshold regime. Such control is necessary in order to improve matching between the ADC and VCO opamps.

The design of the switched-capacitor circuit around the output opamp is an important factor in determining the performance of the reconfigurable ADC. In one embodiment, the first four blocks B1–B4 employ NMOS switches while the last four blocks B5–B8 utilize full CMOS switches. As known to one of ordinary skill in the art, NMOS possess a smaller charge injection for the same switch resistance. The CMOS switches employ complementary devices in order to enhance the acceptable input range. This arrangement can handle a relatively large output range of an ADC configured for eight bit resolution, which corresponds to a pipeline with only the last three blocks B5–8 enabled.

Figure 7:
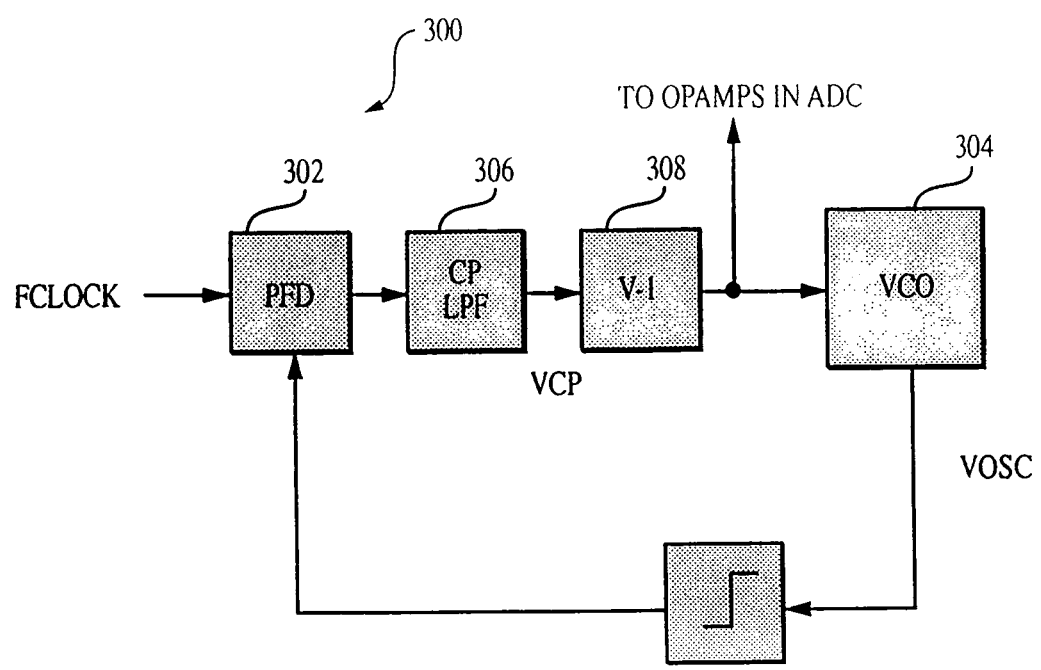
FIG. 7 is a block diagram of a PLL circuit that can form a part of the ADC of FIG. 1.

FIG. 7 shows an exemplary phase-locked loop circuit 300 for tracking of the opamp bias current as the ADC input bandwidth is varied from about 20 Mhz to about 1 Hz, which corresponds to at least 3 orders of magnitude clock frequency tracking. The PLL circuit 300 includes a Phase-Frequency detector (PFD) 302 for sensing differences between the ADC clock frequency $F_{clock}$ and the frequency of a local on-chip voltage-controlled oscillator (VCO) 304. The frequency information is fed to the charge-pump (CP) 306 that changes its output voltage corresponding to the change in the difference between the clock and VCO frequencies. The CP can include a low pass filter (LPF) circuit. The output voltage signal from the CP 306 is then converted to a current by a Voltage-to-Current converter (VIC) 308 and then fed, as bias currents, to the ADC and VCO.

Figure 8:
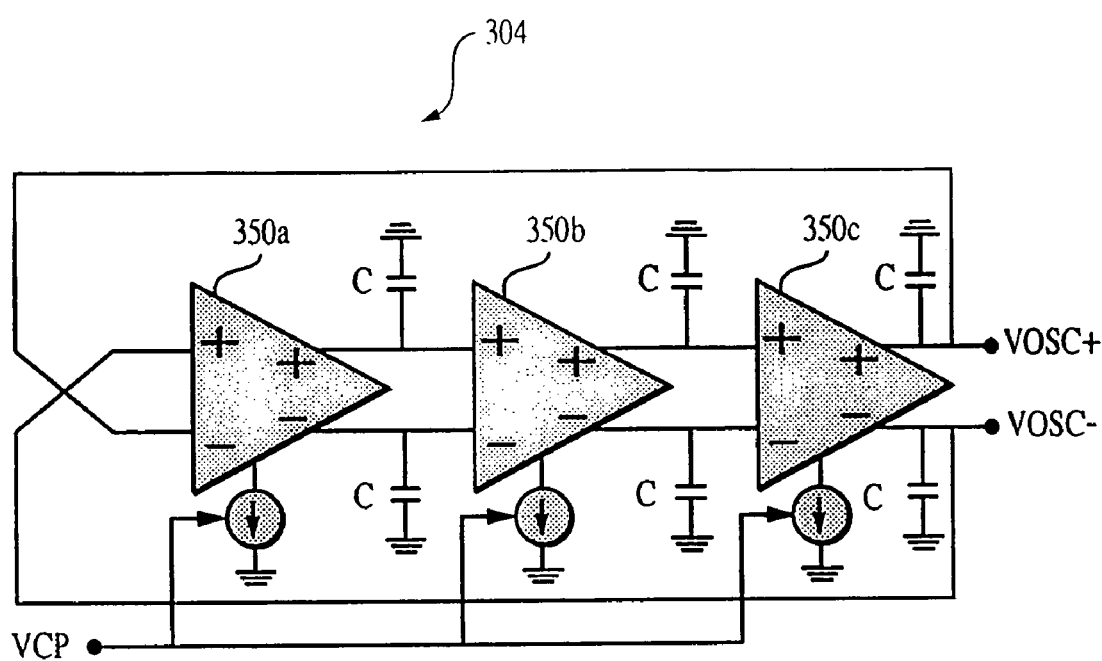
FIG. 8 is an exemplary schematic diagram of the PLL circuit of FIG. 7.
Figure 8A:
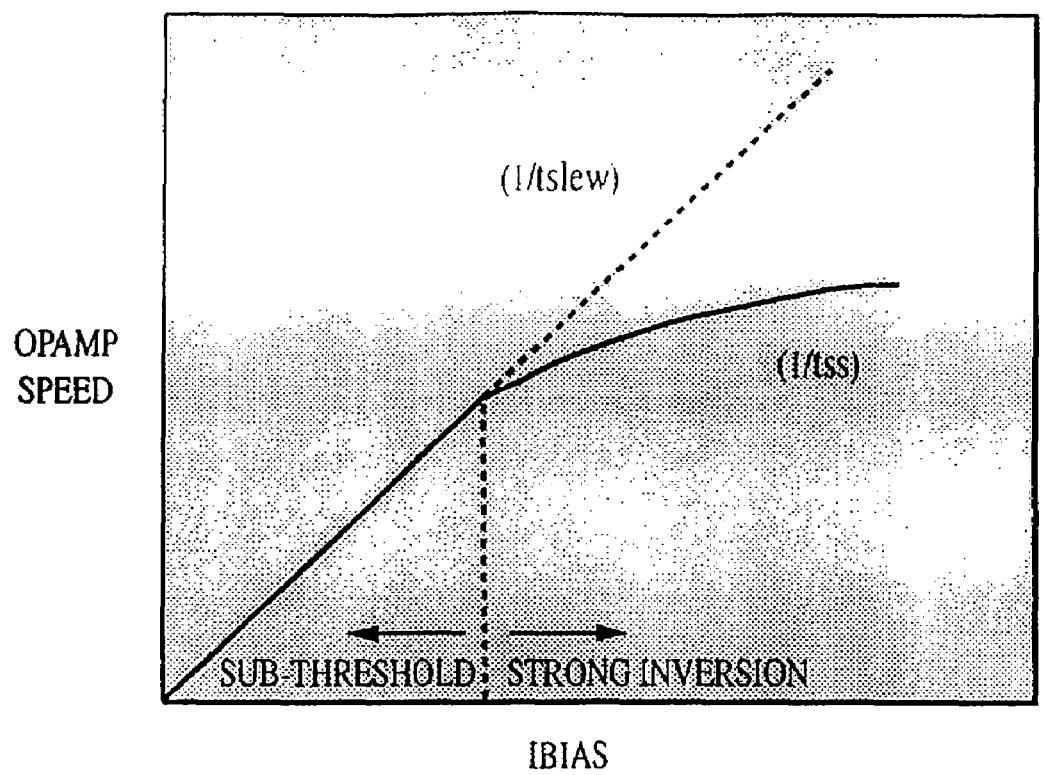
FIG. 8A is a graphical representation of the bias current versus opamp speed for the opamp of FIG. 6.

In one embodiment shown in FIG. 8, the VCO is constructed from three opamps 350a,b,c that are replicas of the opamps in the reconfigurable blocks B1-N. With this arrangement, the VCO frequency, $F_{vco}$, is proportional to the speed (transconductance) of the opamps, which, is in turn proportional, in a non-linear way to the bias current fed to the opamps, as shown in FIG. 8A. If the difference between $F_{clock}$ and $F_{vco}$ is not zero, the action of the PFD, CP and VIC changes the bias current of the VCO to make $F_{vco}$ ultimately (in steady state) track $F_{clock}$.

If $F_{clock}$ is increased, i.e., the ADC is clocked at a higher sampling frequency, the bias current fed to the opamps in the VCO and ADC is increased in such a manner that the speed of the opamps is linearly proportional to the input clock frequency. Thus, the settling time of the opamps in the ADC is proportional to the input clock frequency, regardless of the relationship between the transconductance of the opamps and the bias current.

In one embodiment, the opamps 350 employed in the VCO have a telescopic architecture without gain enhancement amplifiers. The VCO opamps can be an exact replica of the telescopic structure used in blocks B3–8. Since the VCO opamps 350 do not have gain-enhancement amplifiers the bias circuit for VCO opamp biases the telescopic structure alone. Thus, the bias circuits for the VCO amplifiers 350 can be identical to the bias circuits in blocks B6–B8. That is, the VCO opamp bias circuits utilize discrete-time switched-capacitor common-mode feedback (CMFB) as in the main ADC. Although this arrangement changes the opamp loading from the high clock phase to the low clock phase, the overall influence on the VCO frequency is insignificant due to the relatively small size of the CMFB capacitors with respect to the overall opamp loading.

And since the outputs of the opamp are fed to the inputs of the next opamp successively through the VCO, the common-mode outputs of the opamps are maintained, using CMFB, at the level of the input common-mode voltage, and not at a fixed level as in the main ADC. Hence, with changing bias current through the opamp, this level also changes. It is understood that the transistors should remain in saturation mode through the entire working range of the opamps as the bias current is reduced (i.e. through strong and weak inversion and sub-threshold regimes). To achieve this, diode limiters can be placed across the differential opamp outputs to allow a small oscillation amplitude (+/−300 mv single-sided) at the output of each opamp. In one embodiment, diodes (implemented using MOSFETs) are placed across the differential outputs of the VCO opamps to limit the differential output level of the opamps to the forward bias voltage of the diodes, i.e. approximately 600 mV.

The reconfigurable blocks B1-N and VCO opamps 350 should be small signal dominated for the most part. That is, even in the worst case, i.e., the point where the opamp input transistors move from strong inversion into the sub-threshold regime as bias current is reduced, the slewing time should about equal the small-signal settling time. In all other conditions, such as when the transistors are in strong inversion, the small signal settling time automatically becomes larger than the slewing time. In the condition that the input devices of the opamp are in strong inversion (VCO and ADC), it is important that the oscillation frequency of the VCO also be dominated by the small-signal speed of the opamps and not their slew rate. In one embodiment, limiting the opamp amplitude to about 600 mv, which is about a fourth of the overall swing of the opamp, is sufficient to ensure that the oscillation frequency is substantially dependent on the small signal characteristics of the opamp.

In one embodiment, the PLL comparator includes an opamp that is identical to the opamp used in the VCO. Differentially, the opamp is placed in open loop while the CMFB places the opamp in common-mode feedback. By using an opamp for the PLL comparator, the same current that is fed to the VCO opamps can also be fed to the comparator opamp. Thus, their unity gain frequencies track each other so that the power consumption of the comparator changes with the overall power consumption of the ADC. In addition, because the comparator opamp has a smaller load at its output, its unity gain frequency is higher than the unity gain frequency of the opamps in the VCO. This leads the comparator to have a reasonable gain at the VCO oscillation frequency. In one embodiment, the gain is about 10 (regardless of frequency of oscillation), which is enough to convert the +/−300 mV oscillation amplitude to a rail-to-rail digital signal. Further, the common-mode level of the VCO oscillations changes through a wide range with varying bias current. It is relatively difficult for a latch-type comparator to function through a comparable range of common-mode levels. The input common-mode level of the replica opamp used as the comparator would have a desired input common-mode level equal to the common-mode level of the VCO oscillations under all conditions.

The PLL and VCO described herein provide an elegant technique for varying the bias current of the ADC. It will be appreciated by one of ordinary skill in the art that alternative PLL arrangements can be used in conjunction with the present invention. In general, the VCO oscillation frequency should track the bias current or any other controlling signal in proportion to the way the settling time of the amplifiers in the ADC tracks the bias current in its constituent opamps or any other corresponding controlling signal that controls speed of the opamp. It is understood that other techniques for determining analog-to-digital converter opamp bias currents to obtain a desired amplifier transconductance will be readily apparent to one of ordinary skill in the art.

Figure 9:
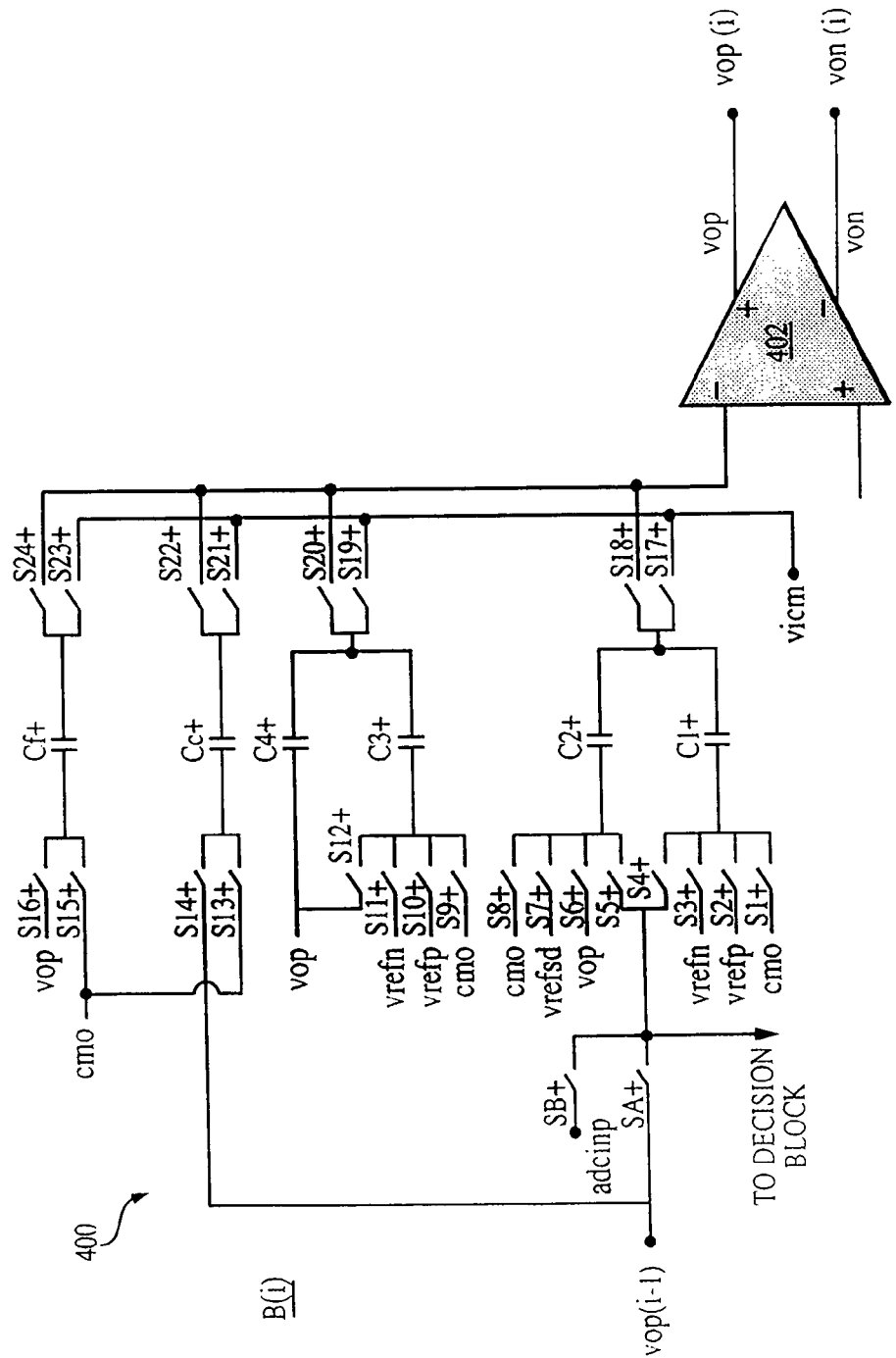
FIG. 9 is a schematic representation of the reconfigurable block of FIG. 2.

FIG. 9 shows an exemplary embodiment of a switching matrix 400 that can form a portion of the reconfigurable blocks B1-N including the switching matrices 114 and block capacitor array 112 (FIG. 2). It is understood that FIG. 9 shows a positive portion marked with a "+" or "p" indication of the differential matrix. That is, the circuit includes a negative portion ("−" or "n") of the differential matrix (not shown) that is a mirror of the positive portion. In general, selected portions of the switching matrix 400 are active depending upon the ADC mode of operation. More particularly, the block elements are configured to provide the pipeline or sigma-delta architecture.

The switching matrix 400 for a reconfigurable block B(i) includes a differential opamp 402, a plurality of switches S1–24+, and a plurality of capacitors C1–4+, Cc+,Cf+ arranged as shown. The switching matrix 400 receives the ADC input signal adcinp that is to be digitized and the output signal Vop(i−1) from the previous reconfigurable block B(i−1). It is understood that positive signals of the differential ADC input signal adcinp and block output signal Vop(i−1) are received by a positive portion of the matrix as shown and that negative signals (not shown) of the ADC input signal adcinn and block output signal Von(i−1) are provided to the negative portion of the matrix (not shown).

The switching matrix 400 receives a plurality of signals that can be switched into the circuit as shown. For example, differential reference voltage signals vrefp and vrefn are provided to the matrix. A sigma-delta reference voltage signal vrefsd is provided for sigma-delta operation. A common-mode operation signal cmo is provided for common mode operation. The opamp 402 output signal Vop is provided for allowing feedback to the matrix.

Figure 10:
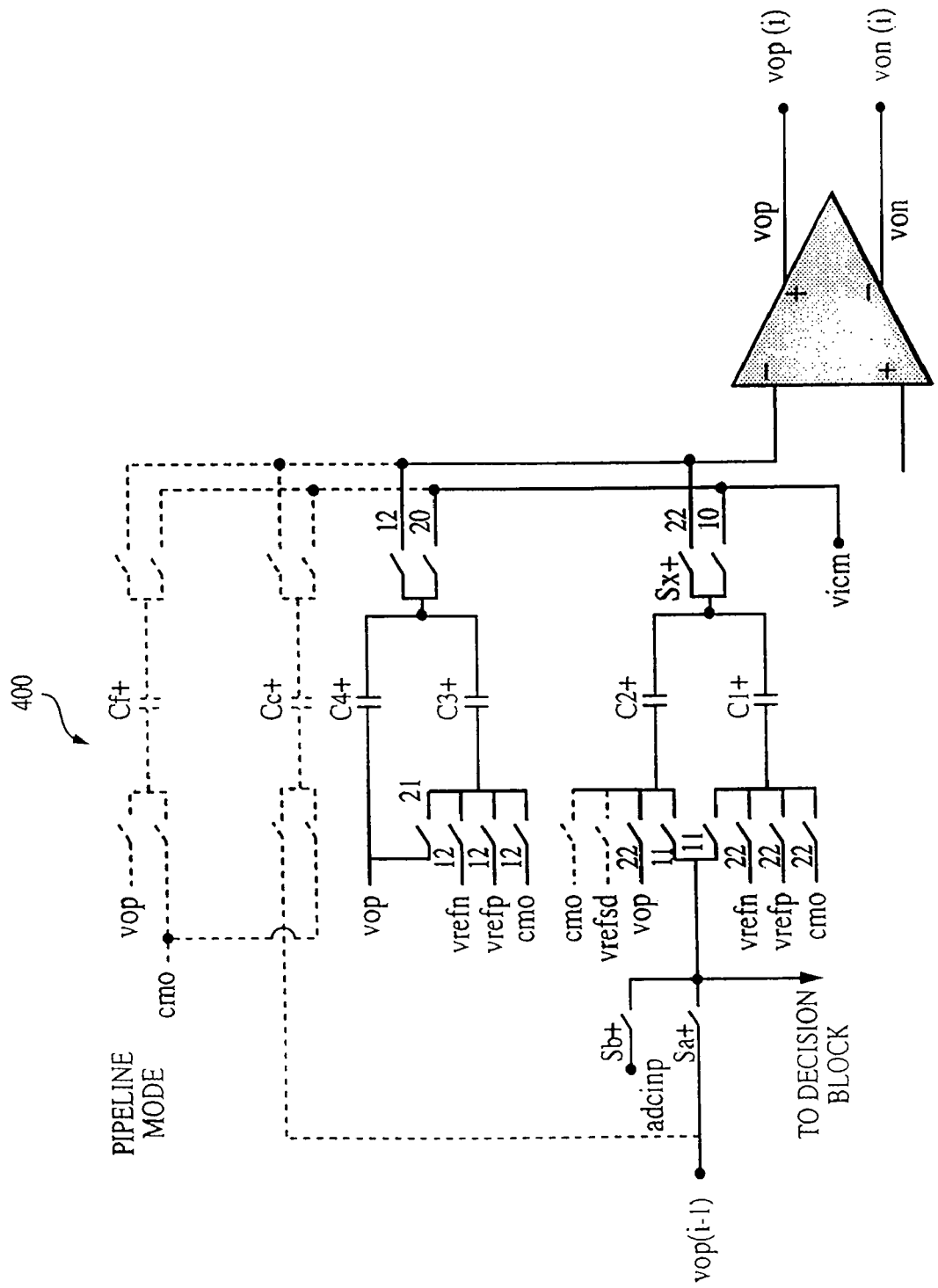
FIG. 10 is a schematic representation of the reconfigurable block of FIG. 2 configured for pipeline operation.
Figure 11:
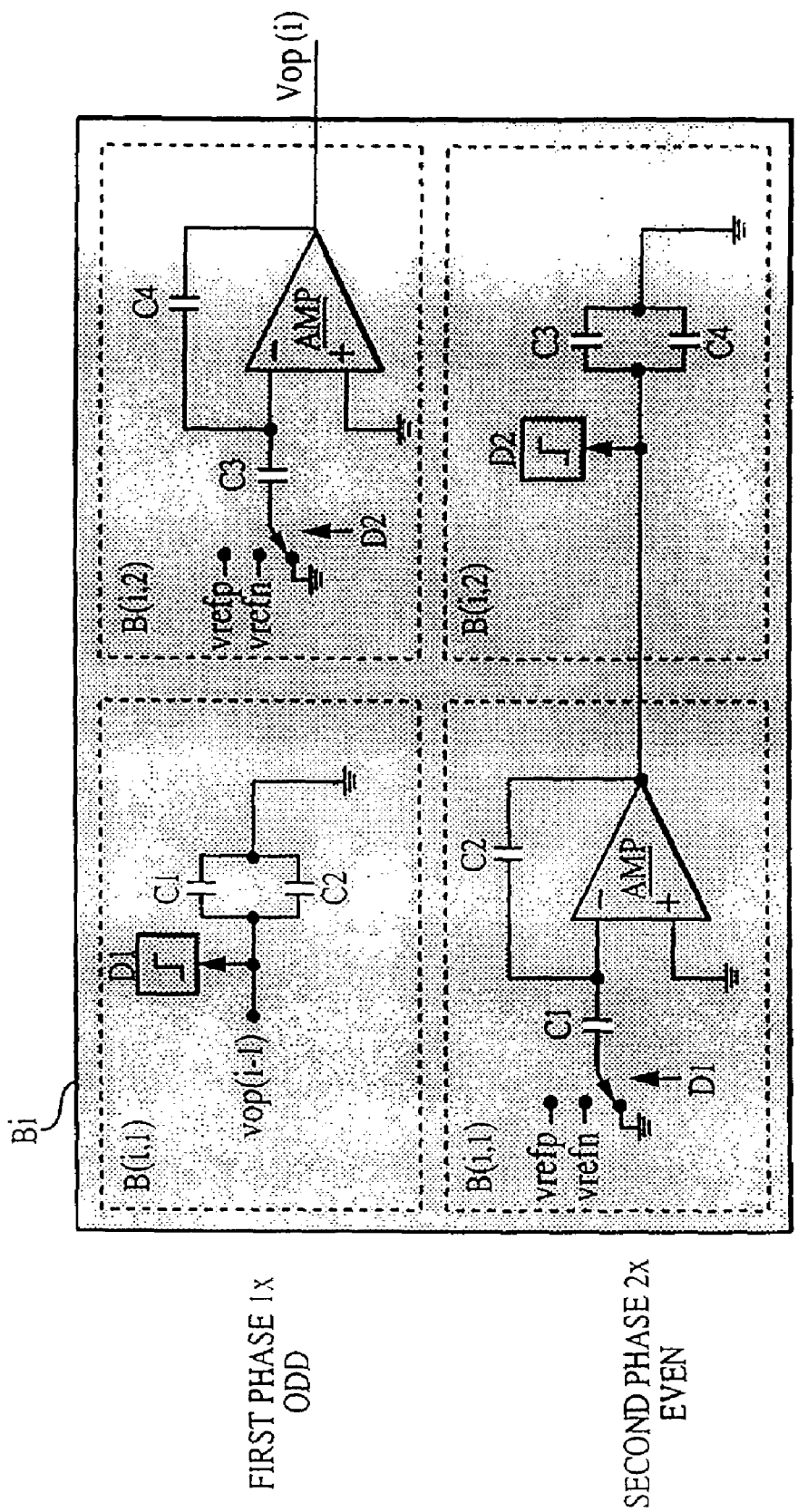
FIG. 11 is schematic diagram of an equivalent circuit for the pipeline architecture of FIG. 10.
Figure 12:
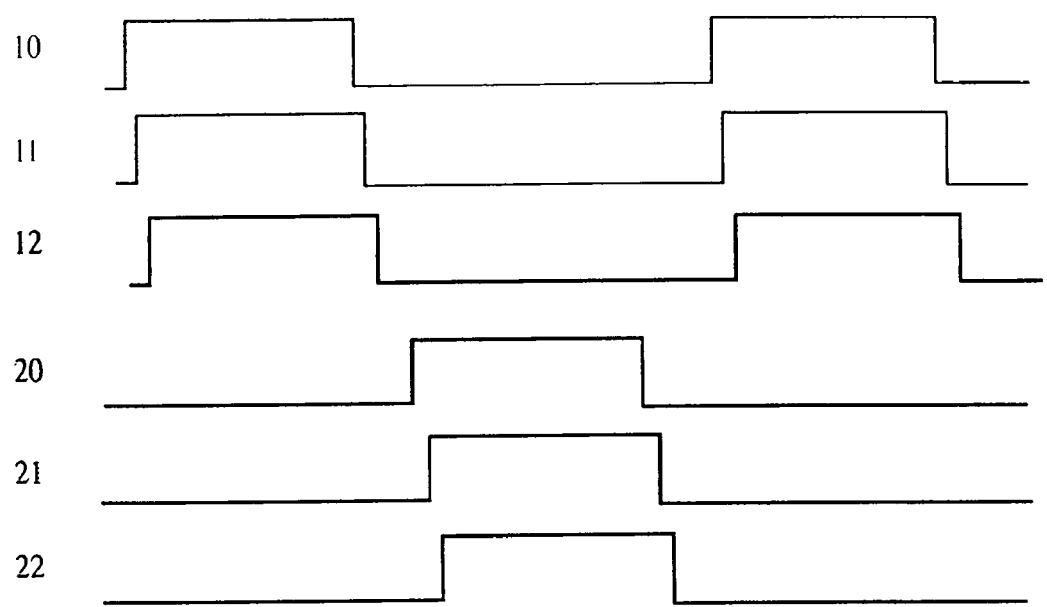
FIG. 12 is a timing diagram showing clocks used to control the reconfigurable block circuit of FIG. 10 and FIG. 13.

FIG. 10 shows the exemplary switching matrix 400 configured to provide the pipeline architecture. The active portions of the matrix are shown in bold and non-active matrix portions are shown in grey. FIG. 11 shows an equivalent circuit for the matrix 400 in pipeline mode. FIG. 12 shows an exemplary series of clocks 10,11,12,20,21,22 that are used to clock the matrix 400. It should be noted that the clocks have two primary phases 10,20 with slightly delayed versions 11,12,21,22 of each primary phase. FIG. 10 indicates the clock phase 10,11,12,20,21,22 used to clock each switch.

In general, each reconfigurable block B(i) includes first and second stages B(i,1),B(i,2) as illustrated by the equivalent circuit of FIG. 11. For the first pipeline stage in each reconfigurable block (odd pipeline stages), the first and second capacitors C1,C2 sample the opamp AMP output signal Vop(i−1) from the previous reconfigurable block B(i−1) during the first phase 1x (clocks 10,11,12). During this phase, the amplifier AMP is positioned in the second stage B(i,2) in amplification mode.

In the second (even) phase 2x (clocks 20,21,22), the amplifier AMP is positioned in the first stage B(i,1) with capacitors C1,C2 coupled around it as shown in FIG. 11 with one plate of capacitor C1 connected to one of the vrefp, vrefn, and ground signals depending on signals from the comparators, described below. The third and fourth capacitors C3,C4 operate in the second (or even) pipeline stage. More particularly, the third and fourth capacitors C3,C4 sample the output of the first stage B(i,1) of the block B(i) during the second phase 2x. The capacitors C3,C4 are then placed in a feedback configuration about the opamp during the first phase to execute a multiply by two operation and a decision dependent shift operation on Vop(i,1) to create the reconfigurable block output Vop(i). This signal Vop(i) then serves as the input to the next reconfigurable block B(i+1).

Figure 13:
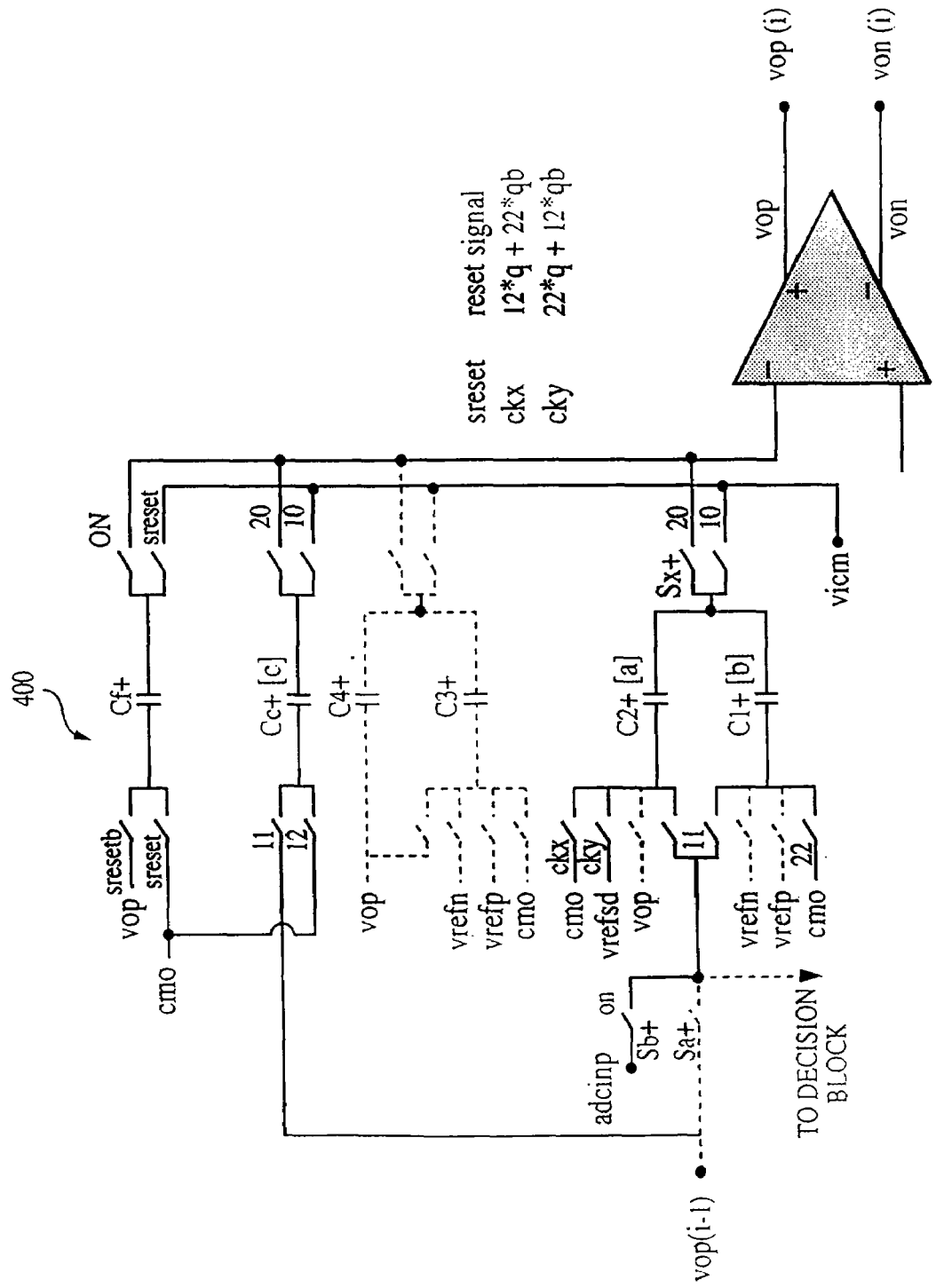
FIG. 13 is a schematic representation of the reconfigurable block of FIG. 2 configured for sigma-delta operation.
Figure 14:
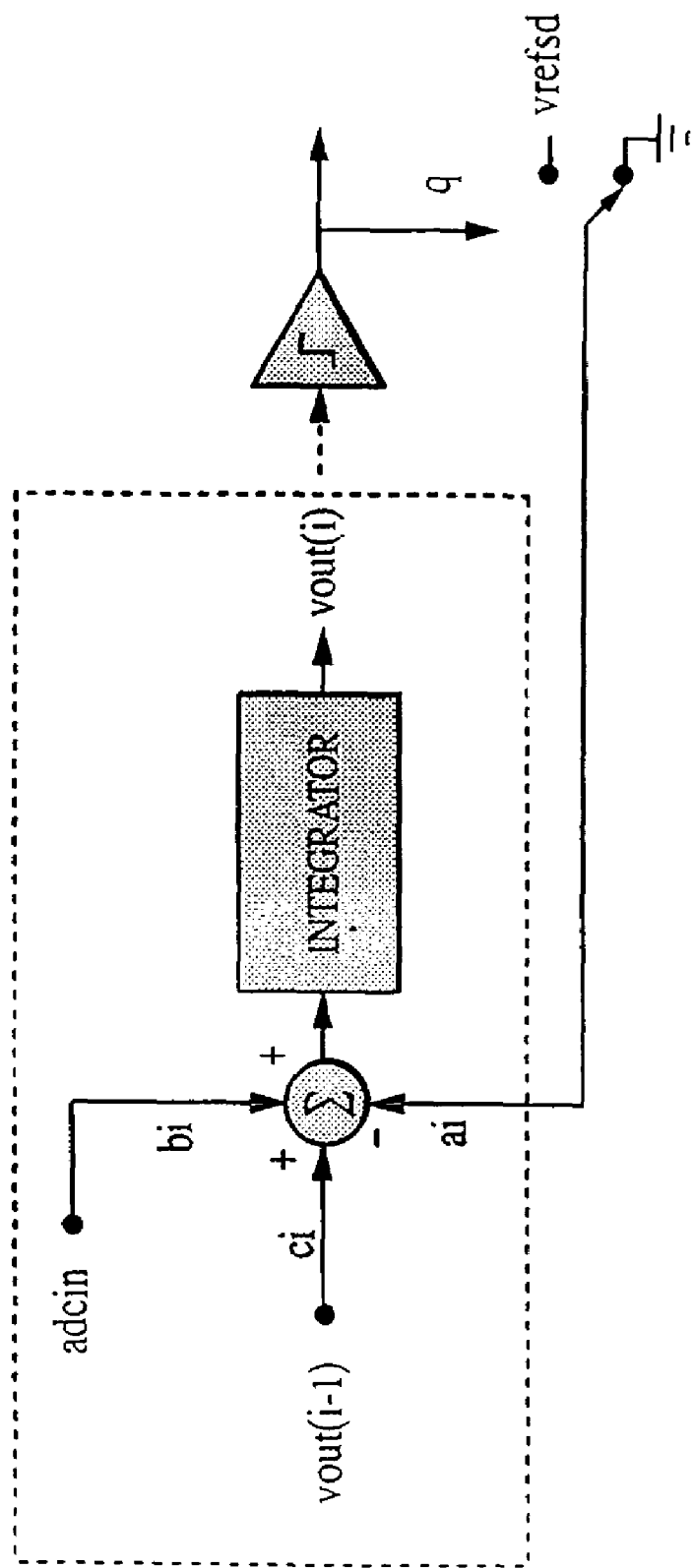
FIG. 14 is a schematic diagram of an equivalent circuit for the sigma-delta block architecture of FIG. 13.

FIGS. 13 and 14 show the switch matrix 400 configuration and equivalent circuit respectively for sigma-delta operation. In general, the ratios between the various capacitors C1/Cf, C2/Cf, and Cc/Cf implement the coefficients b,a, and c, respectively as illustrated in FIG. 14.

In one embodiment, the switch sx+ adjacent a first plate of the first and second capacitors C1,C2 is turned off at the same time or slightly after the switches adjacent the second plate of the first and second capacitors C1,C2 in the sigma-delta mode to address charge injection concerns. The same switch sx+ is turned off before the switch adjacent the second plate of the capacitors in the pipeline mode to minimize charge injection in the pipeline mode.

Figure 15:
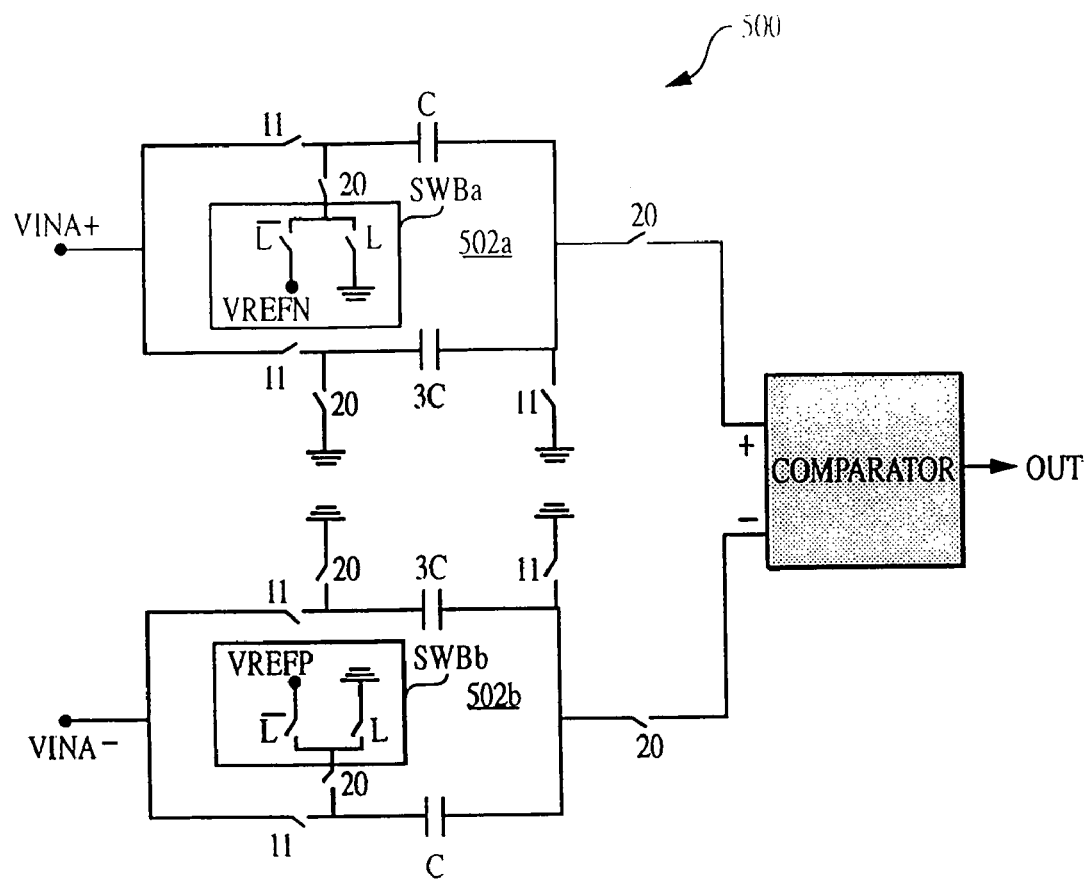
FIG. 15 is a schematic representation of a switch-capacitor comparator circuit used to provide programmable voltage thresholds in accordance with the present invention.
Figure 15A:
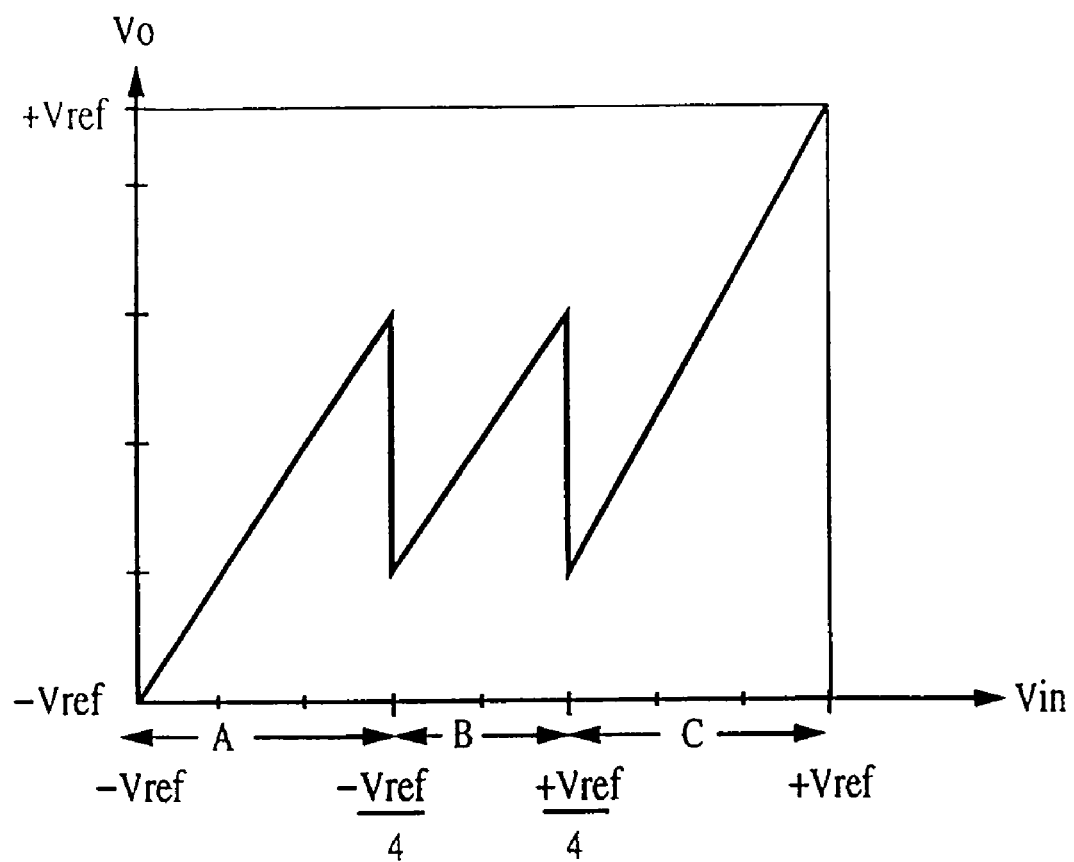
FIG. 15A is a graphical depiction of a transfer function used in an exemplary embodiment of a programmable ADC in accordance with the present invention.

FIG. 15 shows a programmable comparator circuit 500 used in one embodiment of an ADC in accordance with the present invention. In general, the programmable comparator circuit 500 implements the transfer function shown in FIG. 15A. More particularly, the transfer function includes a first range A ranging from −Vref to −Vref/4, a second range B from −Vref/4 to +Vref/4, and a third range C from +Vref/4 to +Vref.

The switched capacitor circuit 500 includes a first portion 502a receiving a positive differential input voltage signal VINA+ and a second portion 502b receiving a negative differential input voltage VINA−. The first portion 502a includes a first capacitor C and a second capacitor 3C, which has a capacitance three times that of the first capacitor C. The second portion 502b includes a similar capacitor configuration. Outputs of the first and second portions 502a,b of the programmable comparator circuit are coupled to a first comparator.

Each of the first and second circuit portions 502a,b further include a switch block SWBa,b for switching in a reference voltage Vrefn, Vrefp or ground. The switch blocks SWBa,b connect to ground when the last block indicator signal L is active. A zero threshold is required for the last stage of the pipeline implementation (which can fall into any of the reconfigurable blocks depending on the resolution of the ADC), as well as for the quantizer in the 4$^{th}$ reconfigurable block in the sigma-delta mode.

The ±Vrefp,n signals implement a 1.5 bit/stage digital error correction in the pipeline mode, which is well known to a person of ordinary skill in the art and described in detail in "A CMOS 13-b Cyclic RSD A/D Converter" by Bernard. Ginetti and Paul G. A. Jespers, IEEE Journal of Solid-State Circuits, Vol. 27, No. 7, July 1992.

Figure 15B:
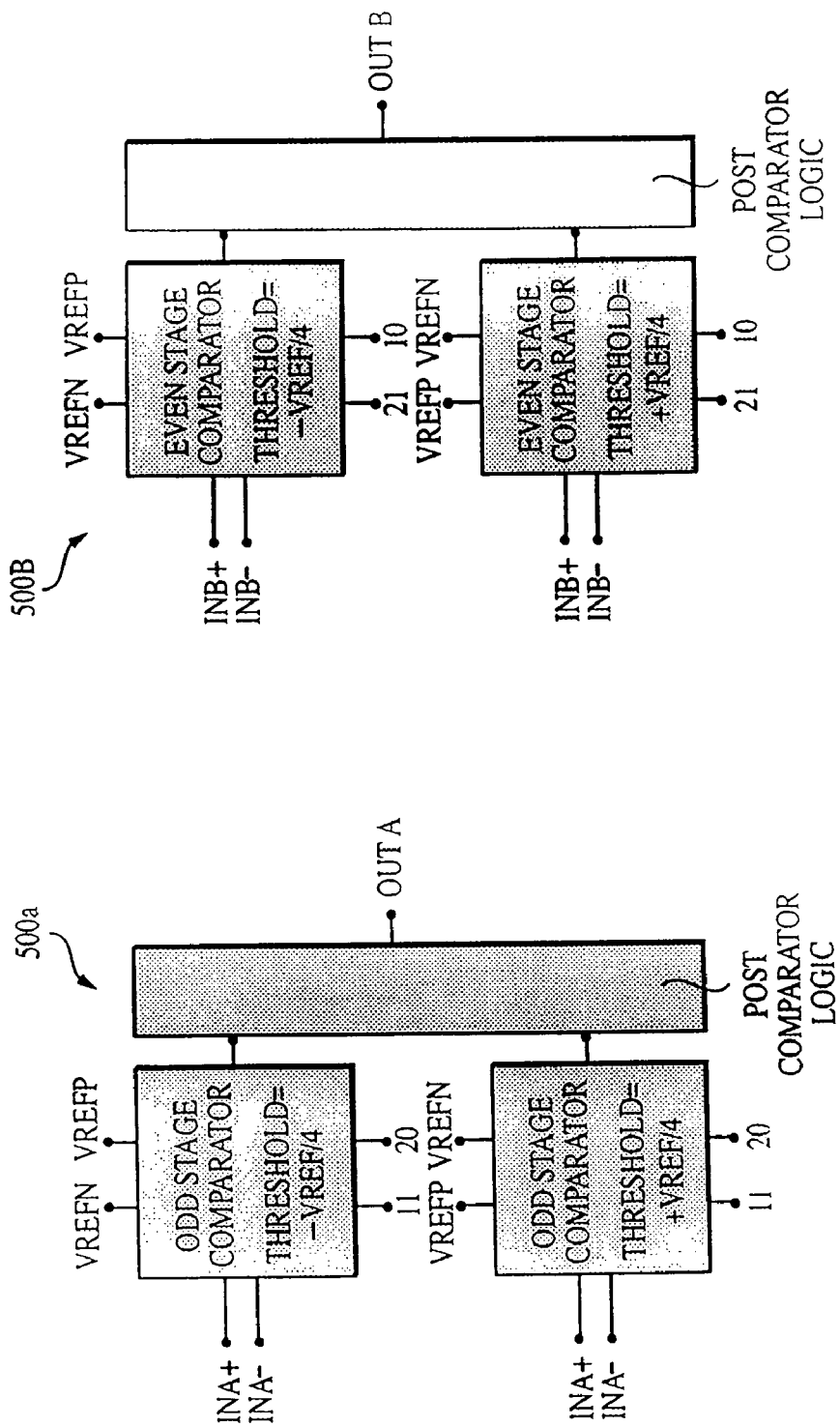
FIG. 15B is a schematic block diagram of dual programmable comparator circuits in accordance with the present invention.

FIG. 15B shows an exemplary embodiment of dual programmable comparator circuits 500a,b, which can be located in the decision block 118 of reconfigurable block (FIG. 2). The first programmable comparator circuit 500a provides error correction for odd pipeline stages and the second programmable comparator circuit 500b provides error correction for even stages. The 1.5 bit digital error correction requires the use of two comparators for each pipeline stage. Thus each reconfigurable block Bi includes two pairs of comparators.

It is understood that one of ordinary skill in the art can readily substitute a variety of other circuits for the programmable comparator circuits shown and described herein. It is further understood that a 1.5 bit/stage digital error correction is used as a means to improve performance of the invention. It will be readily appreciated by one skilled in the art that it is possible to implement a reconfigurable ADC in accordance with the present invention without digital error correction. In addition, some other form of performance enhancement circuitry, such as over-range protection, can be used without departing from the scope of the described invention.

In an exemplary embodiment, a reconfigurable ADC has a resolution range of 2 bits to 18 bits and an input bandwidth of from 1 Hz to 20 Mhz (approx. 40 Khz sampling frequency). Table 3 below shows possible signal types for processing by the ADC with corresponding power consumption estimates. The ADC has a mode change time of about 12 clock cycles, regardless of its desired operating point.

TABLE 3

| Application | Resolution (bits) | Speed | Analog Power Consumption (mW) |
| --- | --- | --- | --- |
| Video | 10 | 4 MHz | 1 mW |
| Audio | 16 | 10 kHz | 12.5 mW |
| Temperature/Seismic/ | 16 | 100 Hz | <1 mW |
| IF in Radio Receivers | 8 | 20 MHz | 2 mW |

In a further feature of the invention, opamp offsets are globally chopped. In conventional pipeline ADCs, the offset of the opamps are cancelled by an auto-zero technique achieved by placing the opamp in unity gain feedback during the sampling phase. In the pipeline mode of the reconfigurable ADC of the present invention, the opamp is shared between two consecutive stages. Thus, the opamp is not available during the sampling phase for offset cancellation.

Figure 16:
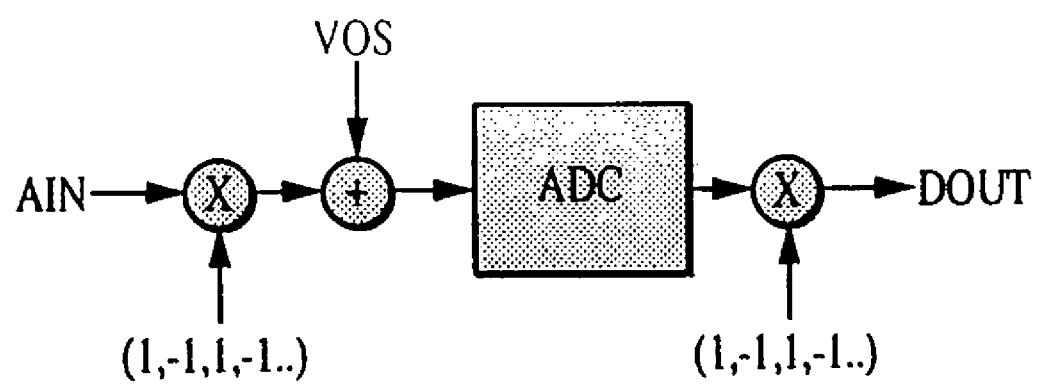
FIG. 16 is a schematic representation of a global chopping scheme in accordance with the present invention.

In accordance with the present invention, 1.5 bit/stage digital error correction is used as shown in FIG. 16. The offset of the opamp does not saturate the next pipeline stage and thus does not cause any non-linearity in the ADC transfer characteristic. Consequently, the offsets of all the opamps in the pipeline can be referred back to the input as one global ADC offset. The global offset is then cancelled by chopping the whole ADC as a single block as shown in FIG. 16. This is achieved simply by swapping the positive and negative inputs every clock cycle. While this approach provides an elegant method of reducing offsets in the present invention, a variety of other offset cancellation schemes well known to persons skilled in the art can be employed.

In general, output chopping is achieved by inverting all the bits of the digital output every other clock cycle. The process of chopping modulates the 1/f noise and offset of the ADC to Fs/2, where Fs is the sampling frequency. The offset can then be eliminated by low-pass filtering the digital output of the ADC.

The global ADC chopping used in the pipeline mode of the reconfigurable ADC is not readily extendible to the sigma-delta mode of operation since chopping the input would modulate the base-band signal to Fs/2. This would require a band-pass modulator centered at Fs/2, which is relatively sensitive to component mismatch.

Figure 17:
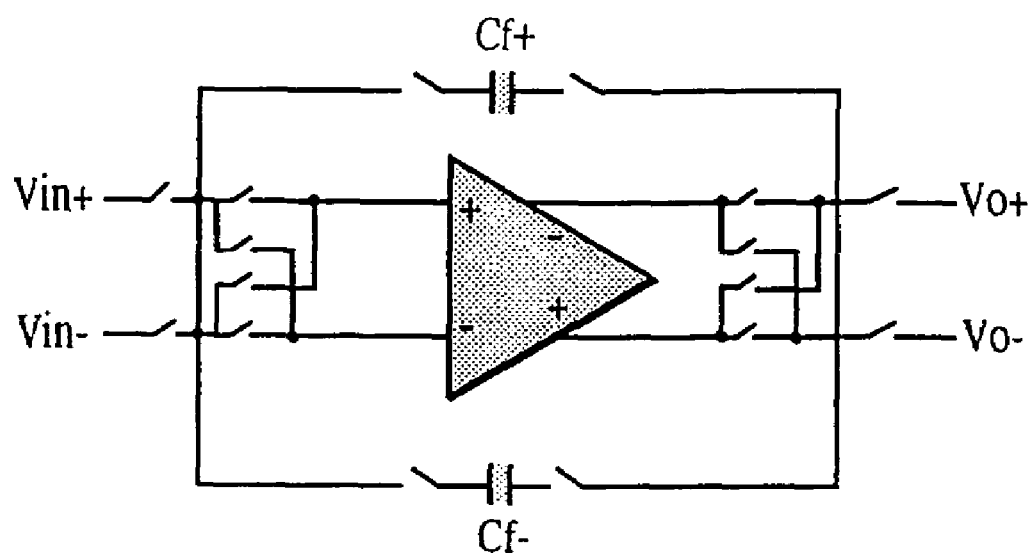
FIG. 17 is a schematic diagram of a prior art opamp offset canceling circuit.

As shown in FIG. 17, conventionally, the first stage opamp in sigma-delta ADCs is chopped to cancel its offset by placing switches in series with the opamp inputs and outputs since the ADC is primarily sensitive to the 1/f noise and offset from the opamp in the first stage. The opamp is then chopped every clock cycle regardless of the surrounding switch-capacitor circuit. Such series switches, however, lead to degraded opamp settling due to finite switch resistance and parasitic capacitance in both the pipeline and sigma-delta modes.

Figure 18:
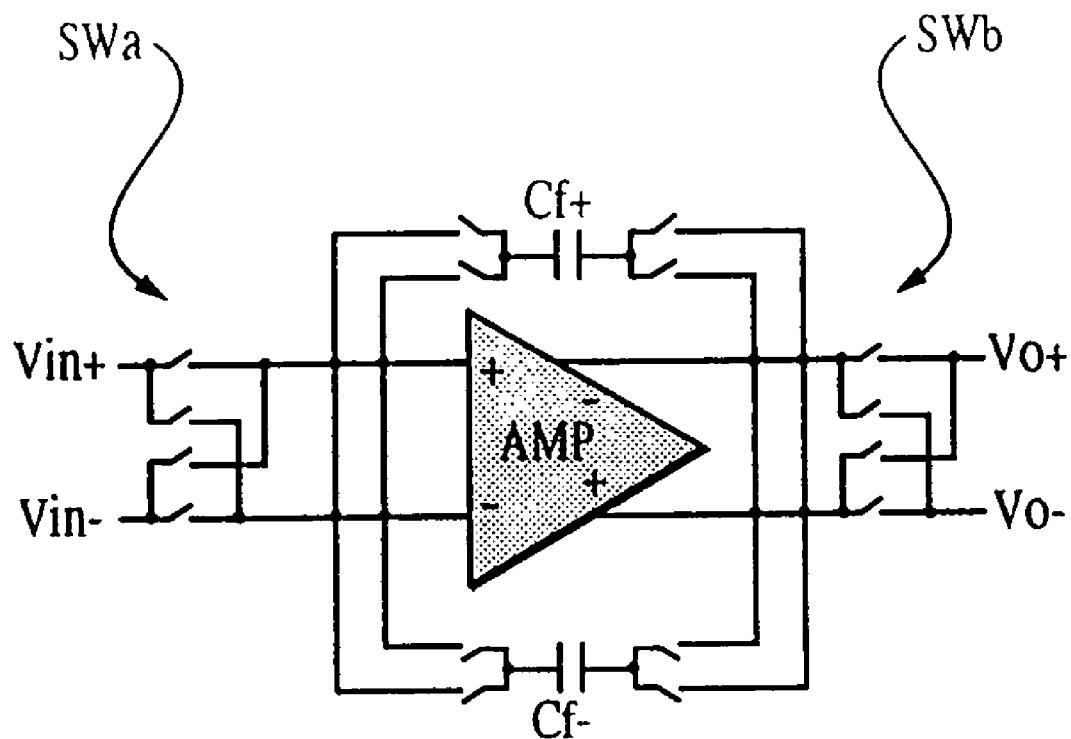
FIG. 18 is a schematic diagram of an opamp offset canceling circuit in accordance with the present invention.

As shown in FIG. 18, in the present invention, opamp chopping for sigma-delta operation is achieved by chopping the switch-capacitor circuit around the opamp AMP instead of the opamp itself. In circuit terms, the switches Swa,Swb can be considered as being in parallel instead of in series. This approach improves opamp settling not only due to elimination of the series resistance of the switches, but also to slightly reduced parasitic capacitance. The above approach can reduce the DC offset of the ADC in sigma-delta mode by about 20 dB or more. As in the case of offset cancellation in the pipeline mode, the offset and 1/f noise in the sigma-delta mode can be cancelled by other methods without departing from the scope of this invention.

Figure 19:
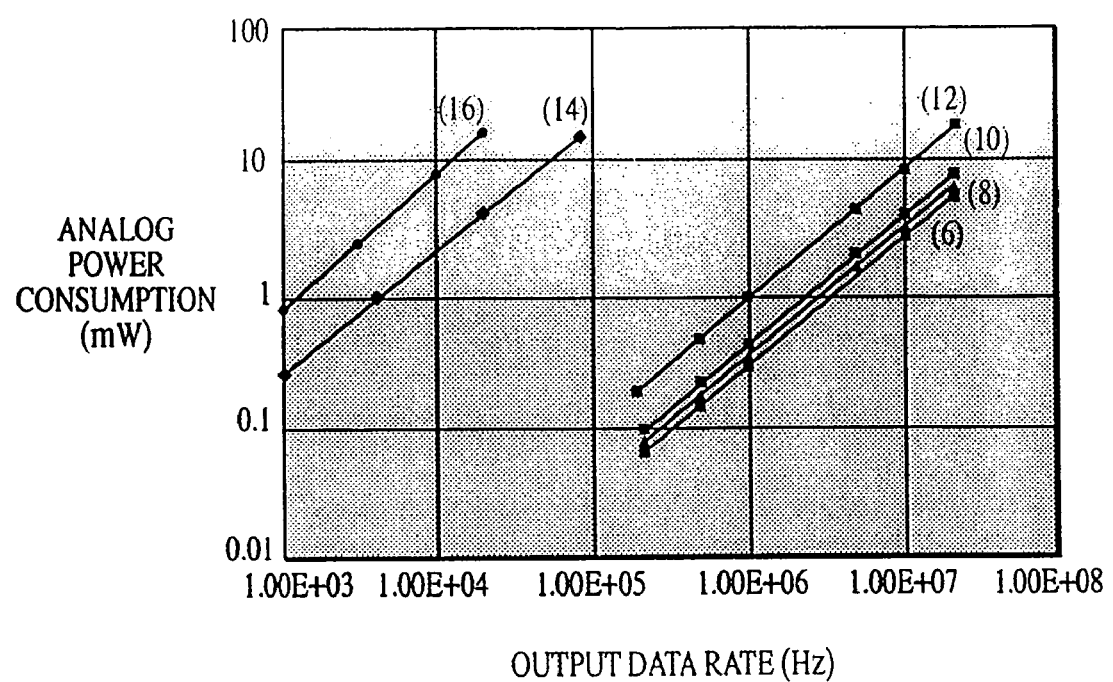
FIG. 19 is a graphical depiction of power consumption versus output data rate and various resolutions.

FIG. 19 shows the estimated relationship between the analog power consumption and the output data-rate and resolution for the exemplary reconfigurable ADC described above. For resolutions greater than 12 bits the ADC is configured for sigma-delta mode and for resolutions equal to or less than 12 bits the ADC is configured for pipeline mode. The output data rate corresponds to the sampling rate and the OSR (which is 1 in the case of the pipeline mode). The power and data rate correspond to the PLL lock range of 100 KHz to 20 MHz.

Since successive stages of the pipeline ADC contribute less noise to the overall digital output signal, successive stages can employ capacitors that are scaled with respect to capacitors in the stages before it. This allows the opamp size to scaled down to reduce power consumption. However, since the last few stages are dominated by the parasitic capacitance of interconnects, it is generally not beneficial to continue to scale the capacitors in these last few stages. In one embodiment, the optimal scale factor between the stages is approximately 0.4–0.6 depending on various process related and design factors. It is believed that this optimal factor is quite broad in this range. Thus, a convenient factor of 0.5 can be chosen. Since two pipeline stages are contained within one block of the reconfigurable ADC, the inter-block scaling factor is 0.25. This choice also paves the way for an elegant parameter reconfiguration methodology when the ADC is in the pipeline mode.

Figure 20:
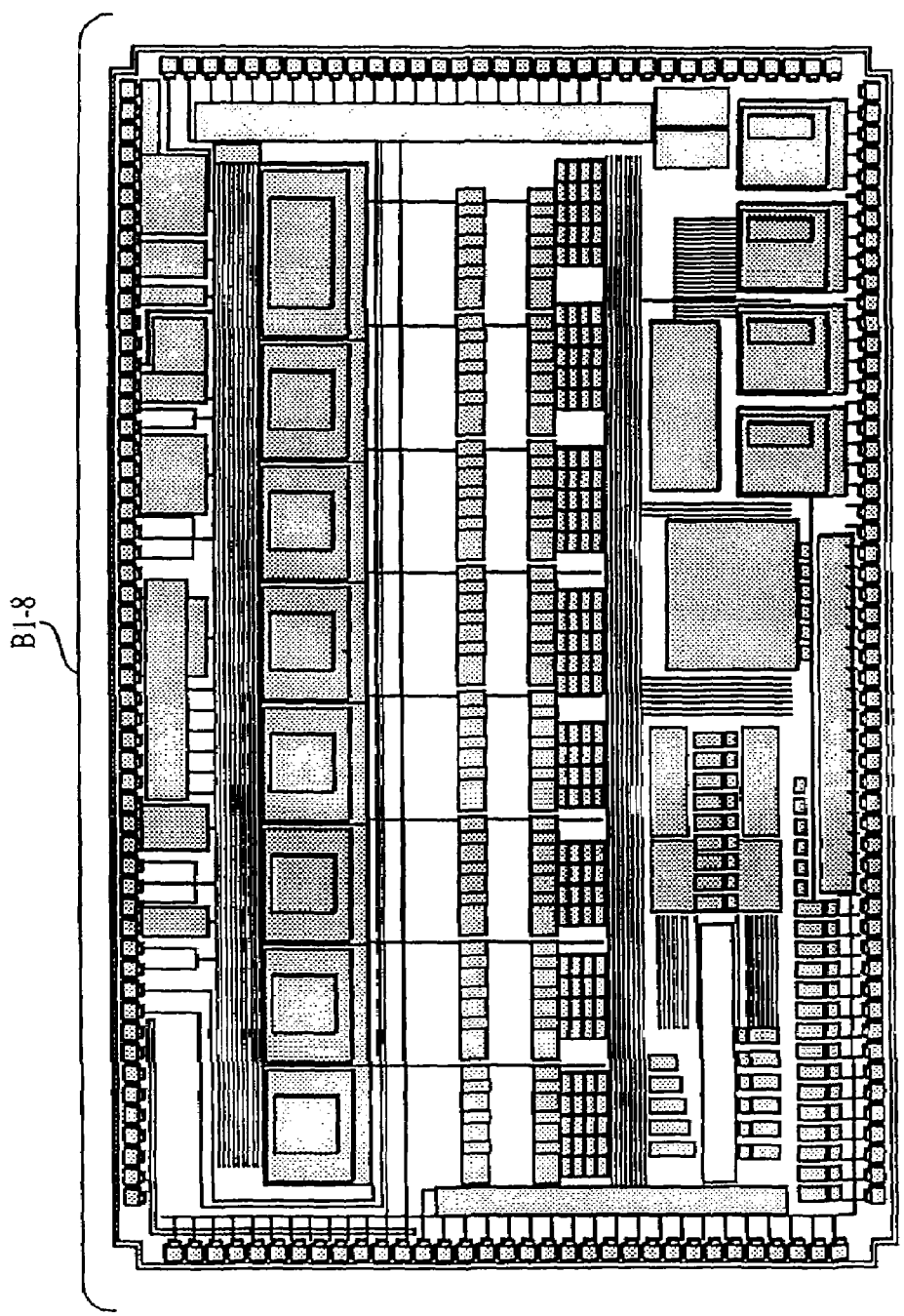
FIG. 20 is a schematic representation of an exemplary layout for the ADC of FIG. 1.

FIG. 20 shows an exemplary layout for a reconfigurable ADC in accordance with the present invention having eight reconfigurable blocks B1–8. In one embodiment, the ADC is packaged in a 160 pin LQFP (Low Profile Quad Flat-pack).

The reconfigurable ADC of the present invention can be fabricated using a variety of processes known to one of ordinary skill in the art. In one embodiment, the ADC is implemented in a 0.6 um 3-metal CMOS process. The die size of the chip core is approximately 10.5 mm×7.5 mm.

The ADC of the present invention finds application in wide variety of areas. For example, the ADC can be employed for digitizing a variety of analog signals such as low I.F. (Intermediate-frequency) signals required in receivers in cell phones and other radio equipment, video, seismic signals, signals from MEMs (Micro-mechanical Machined) devices, voice, audio, amongst others. Each of these signals demand different resolutions and bandwidth of the ADC.

The reconfigurable ADC of the present invention provides significant advantages over conventional devices. The flexible nature of the ADC provides a relatively large resolution range and a relatively wide input bandwidth. In addition, the reconfigurable ADC provides optimal power consumption over its operating range. The ADC provides parametric reconfiguration capability in the pipeline and sigma-delta modes. In the pipeline mode, the number and location of the active blocks can be selected to vary the capacitor size for optimal power consumption through varying resolutions. In sigma-delta mode, the ADC resolution can be reconfigured by controlling the OSR.

The ADC includes further advantages as well. For example, the bias currents in the ADC opamps can be varied automatically with input clock frequency since the PLL and VCO opamps are replicas of the opamps in the main ADC. This arrangement sets the bias currents to the proper value regardless of the chip-to-chip process variation and even variation between processes. In addition, the bias current variation is independent of operating regime of opamp, i.e., strong inversion, weak inversion, and sub-threshold. This allows the ADC to have a large range of speeds over which it is power optimal.

Having described preferred embodiments of the invention, it will now become apparent to one of ordinary skill in the art that other embodiments incorporating their concepts may also be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A reconfigurable ADC circuit, comprising:
a plurality of circuit blocks that are configurable in at least one parameter for an ADC architecture, wherein at least one of the plurality of circuit blocks includes a switching matrix and capacitor array.

2. The circuit according to claim 1, wherein the at least one parameter includes one or more of resolution, power, oversampling ratio, order and bandwidth.

3. The circuit according to claim 2, wherein the ADC architecture is selected from the group consisting of pipeline architecture, sigma-delta, and cyclic.

4. The circuit according to claim 1, wherein the plurality of circuit blocks are configurable to a selected one of a plurality of architectures.

5. The circuit according to 1, wherein the at least one parameter includes oversampling ratio, the architecture includes a sigma-delta architecture, and the oversampling ratio is varied by varying sampling rate.

6. The circuit according to claim 1, wherein the architecture includes a sigma-delta architecture and the at least one parameter includes oversampling ratio, wherein the oversampling ratio is selected based upon a desired resolution.

7. The circuit according to claim 1, wherein the plurality of circuit blocks have a switched capacitor matrix, wherein at least some of the plurality of circuit blocks have differently sized capacitors to reduce thermal noise.

8. The circuit according to claim 1, wherein the architecture include a pipeline architecture and the at least one parameter includes resolution, wherein the resolution corresponds to a number of enabled ones of the plurality of circuit blocks.

9. The circuit according to claim 8, wherein the enabled ones of the plurality of circuit blocks are selected based upon capacitor size in the plurality of circuit blocks.

10. A method of converting an analog signal to a digital signal, comprising:
coupling a plurality of circuit blocks configurable in at least one parameter for a given ADC architecture, wherein at least one of the plurality of circuit blocks includes a switching matrix and capacitor array.

11. The method according to claim 10, wherein the at least one parameter includes one or more of resolution, oversampling ratio, bandwidth, order and power consumption.

12. The method according to claim 11, wherein the plurality of circuit blocks are configurable in a plurality of ADC architectures.

13. The method according to claim 12, wherein the plurality of ADC architectures include pipeline, sigma-delta and cyclic.

14. The method according to claim 10, further including enabling certain ones of the plurality of circuit blocks based upon a selected resolution.

15. A reconfigurable ADC circuit, comprising:
a plurality of circuit blocks configurable in at least one parameter for an ADC architecture, wherein at least some of the plurality of circuit blocks include an opamp and a switching matrix having a capacitor array and switching matrices.

16. The circuit according to claim 15, wherein the at least one parameter includes bandwidth of the opamps.

17. The circuit according to claim 16, wherein the bandwidth of the opamps is varied based on the sampling rate of the ADC.

18. The circuit according to claim 16, wherein the bandwidth of the opamps is varied based on the sampling rate of the ADC to minimize power consumption.

19. The circuit according to claim 18, further including a phase locked loop to provide an ADC opamp bias current based on a sampling clock signal frequency.

20. The circuit according to claim 19, wherein a first input to a phase-frequency detector is a sampling clock signal and a second input to the phase-frequency detector is an oscillator output signal.

21. The circuit according to claim 20, wherein the oscillator includes using back-to-back opamps whose oscillation frequency is dependent on the bias current applied to the amplifiers.

* * * * *

UNITED STATES PATENT AND TRADEMARK OFFICE
CERTIFICATE OF CORRECTION

| | |
|---|---|
| PATENT NO. | : 7,002,501 B2 |
| APPLICATION NO. | : 10/983953 |
| DATED | : February 21, 2006 |
| INVENTOR(S) | : Gulati et al. |

It is certified that error appears in the above-identified patent and that said Letters Patent is hereby corrected as shown below:

Col. 4, line 3, delete "FIG. 11 is schematic" and replace with --FIG. 11 is a schematic--.

Col. 4 line 38, delete "enable" and replace with --enables--.

Col. 7 line 53, delete "sigma-delta mod." and replace with --sigma-delta mode.--.

Col. 7 line 61-62, delete "the resolution is be selected" and replace with --the resolution is to be selected--.

Col. 8 line 7, delete "for ten bits of resolutions," and replace with --for ten bits of resolution--.

Col. 8 line 43, delete "oversampling rate (OSR)." and replace with --oversampling ratio (OSR).--.

Col. 9 line 63, delete "for eight bit resolution," and replace with --for eight bits of resolution,--.

Col. 10 line 36-37, delete "amplifiers the bias circuit" and replace with --amplifiers, the bias circuit--

Col. 13 line 54-55, delete "bandwidth of from" and replace with --bandwidth from--.

Col. 15 line 4, delete "12 bits the ADC" and replace with --12 bits, the ADC--.

Col. 15 line 6, delete "12 bits the ADC" and replace with --12bits, the ADC--.

Col. 15 line 15, delete "to scaled down" and replace with --to be scaled down--.

Col. 15 line 37-38, delete "in wide variety" and replace with --in a wide variety--.

Col. 16 line 28, delete "the circuit according to 1," and replace with --the circuit according to claim 1--.

Col. 16 line 34, delete "includes oversampling ratio," and replace with --includes the oversampling ratio,--.

UNITED STATES PATENT AND TRADEMARK OFFICE
CERTIFICATE OF CORRECTION

PATENT NO.       : 7,002,501 B2
APPLICATION NO.  : 10/983953
DATED            : February 21, 2006
INVENTOR(S)      : Gulati et al.

It is certified that error appears in the above-identified patent and that said Letters Patent is hereby corrected as shown below:

Col 16 line 42, delete "include a" and replace with --includes a--.

Signed and Sealed this

Fifth Day of December, 2006

JON W. DUDAS
*Director of the United States Patent and Trademark Office*